(12) United States Patent
Samples et al.

(10) Patent No.: US 12,322,886 B2
(45) Date of Patent: Jun. 3, 2025

(54) POWER MODULE HAVING ELECTRICAL INTERCONNECTIONS USING MECHANICAL FITTINGS AND PROCESS OF IMPLEMENTING THE SAME

(71) Applicant: CREE FAYETTEVILLE, INC., Fayetteville, AR (US)

(72) Inventors: Ben Samples, Fayetteville, AR (US); Zach Cole, Summers, AR (US); Amol Deshpande, Fayetteville, AR (US)

(73) Assignee: Wolfspeed, Inc., Durham, NC (US)

( * ) Notice: Subject to any disclaimer, the term of this patent is extended or adjusted under 35 U.S.C. 154(b) by 666 days.

(21) Appl. No.: 17/228,148

(22) Filed: Apr. 12, 2021

(65) Prior Publication Data

US 2022/0328990 A1 Oct. 13, 2022

(51) Int. Cl.
| | | |
|---|---|---|
| H05K 7/12 | (2006.01) | |
| H01R 12/70 | (2011.01) | |
| H01R 13/514 | (2006.01) | |
| H05K 7/14 | (2006.01) | |

(52) U.S. Cl.
CPC ....... *H01R 12/7088* (2013.01); *H01R 13/514* (2013.01); *H05K 7/12* (2013.01); *H05K 7/1422* (2013.01)

(58) Field of Classification Search
None
See application file for complete search history.

(56) References Cited

U.S. PATENT DOCUMENTS

| | | | |
|---|---|---|---|
| 11,805,592 B2* | 10/2023 | Deng | H05K 7/023 |
| 2014/0209344 A1* | 7/2014 | Kalayjian | H02G 5/00 |
| | | | 174/68.2 |
| 2015/0282383 A1* | 10/2015 | Singh | H05K 7/20927 |
| | | | 361/689 |
| 2019/0157819 A1* | 5/2019 | Hieda | H01R 27/02 |
| 2021/0074333 A1* | 3/2021 | Zhao | G11C 8/18 |
| 2021/0098765 A1* | 4/2021 | Weinberger | H01M 50/287 |
| 2021/0313243 A1* | 10/2021 | McPherson | H01L 23/4334 |

OTHER PUBLICATIONS

"CPWR-AN41 FM3 Mounting Instructions and PCB Requirements"; Cree Inc.; © 2021; 17 pages.

* cited by examiner

*Primary Examiner* — Courtney L Smith
(74) *Attorney, Agent, or Firm* — BakerHostetler

(57) ABSTRACT

A power module includes at least one power substrate; a plurality of power devices arranged on the at least one power substrate; and a power connector configured to be electrically connected to the plurality of power devices. The power connector includes a mechanically compliant fitting.

30 Claims, 18 Drawing Sheets

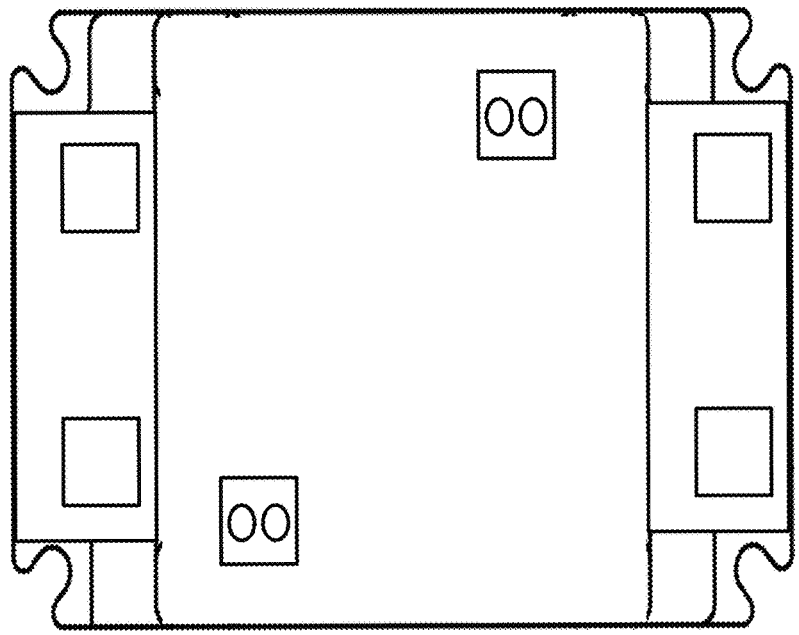
Figure 4B
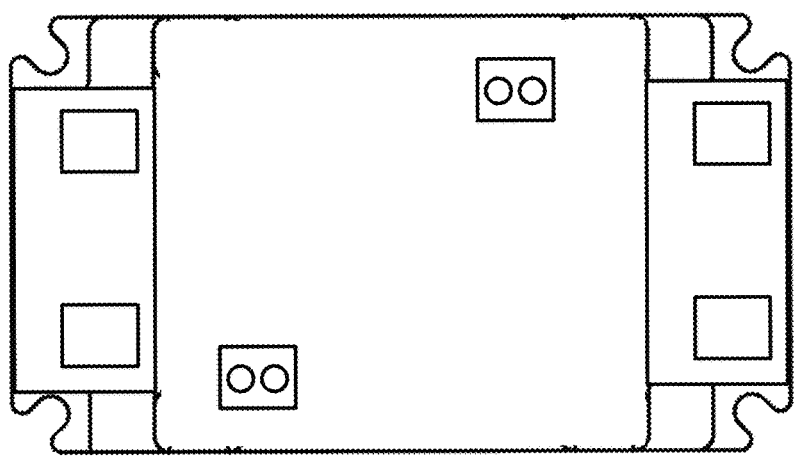
Figure 4A
FIG. 4

POWER MODULE HAVING ELECTRICAL INTERCONNECTIONS USING MECHANICAL FITTINGS AND PROCESS OF IMPLEMENTING THE SAME

BACKGROUND OF THE DISCLOSURE

As will be appreciated by those skilled in the art, power modules are known in various forms. Power modules provide a physical containment for power components, usually power semiconductor devices. These power semiconductors are typically soldered or sintered on a power electronic substrate. The power module typically includes power terminals and signal terminals. Moreover, the power module utilizes numerous power interconnections and signal interconnections between the power semiconductors, the power terminals, the signal terminals, and/or the like.

Currently the power interconnections and signal interconnections for power modules utilize many bond wires for each of the power semiconductors between the power semiconductors, the power terminals, and the signal terminals. Additionally, each of these bond wires require ultrasonic welding or soldering at each end to the power semiconductors, the power terminals, and the signal terminals. With this construction, power modules require substantial manufacturing time, labor-intensive manufacturing steps, complex systems to aid in the manufacturing process, and/or the like that results in increased manufacturing costs, manufacturing time, and manufacturing complexity.

Also, power modules require accurate component positioning and attachment. In this regard, current power module assembly techniques use dedicated alignment features to accurately place and assemble the numerous components of the power module during manufacturing. This likewise increases manufacturing costs, manufacturing time, and manufacturing complexity.

Accordingly, what is needed is a power module configuration having components that reduce manufacturing time, manufacturing cost, manufacturing complexity, and/or the like. Moreover, what is needed is a power module implementation process utilizing components that reduce manufacturing time, manufacturing cost, manufacturing complexity, and/or the like.

SUMMARY OF THE DISCLOSURE

One general aspect includes a power module that includes at least one power substrate; a plurality of power devices arranged on the at least one power substrate; and a connector configured to be electrically connected to the plurality of power devices, where the connector include a mechanically compliant fitting.

One general aspect includes a power module, that includes at least one power substrate; a plurality of power devices arranged on the at least one power substrate; and a power connector configured to be electrically connected to the plurality of power devices, where the power connector includes a mechanically compliant fitting.

One general aspect includes a power module, that includes at least one power substrate; a plurality of power devices arranged on the at least one power substrate; and a signal connector configured to be electrically connected to the plurality of power devices, where the signal connector includes a mechanically compliant fitting.

One general aspect includes a power module, that includes at least one power substrate; a plurality of power devices arranged on the at least one power substrate; a signal connector configured to be electrically connected to the plurality of power devices; and a power connector configured to be electrically connected to the plurality of power devices.

One general aspect includes a process of configuring a power module, that includes providing at least one power substrate; arranging a plurality of power devices on the at least one power substrate; and electrically connecting a power connector to the plurality of power devices, where the power connector includes a mechanically compliant fitting.

One general aspect includes a process of configuring a power module, that includes providing at least one power substrate; arranging a plurality of power devices on the at least one power substrate; and electrically connecting a signal connector to the plurality of power devices, where the signal connector includes a mechanically compliant fitting.

Additional features, advantages, and aspects of the disclosure may be set forth or apparent from consideration of the following detailed description, drawings, and claims. Moreover, it is to be understood that both the foregoing summary of the disclosure and the following detailed description are exemplary and intended to provide further explanation without limiting the scope of the disclosure as claimed.

BRIEF DESCRIPTION OF THE DRAWINGS

The accompanying drawings, which are included to provide a further understanding of the disclosure, are incorporated in and constitute a part of this specification, illustrate aspects of the disclosure and together with the detailed description serve to explain the principles of the disclosure. No attempt is made to show structural details of the disclosure in more detail than may be necessary for a fundamental understanding of the disclosure and the various ways in which it may be practiced. In the drawings:

FIG. 4A illustrates a first power module configuration according to aspects of the disclosure.

FIG. 4B illustrates a second power module configuration according to aspects of the disclosure.

DETAILED DESCRIPTION OF THE DISCLOSURE

Figure 1:
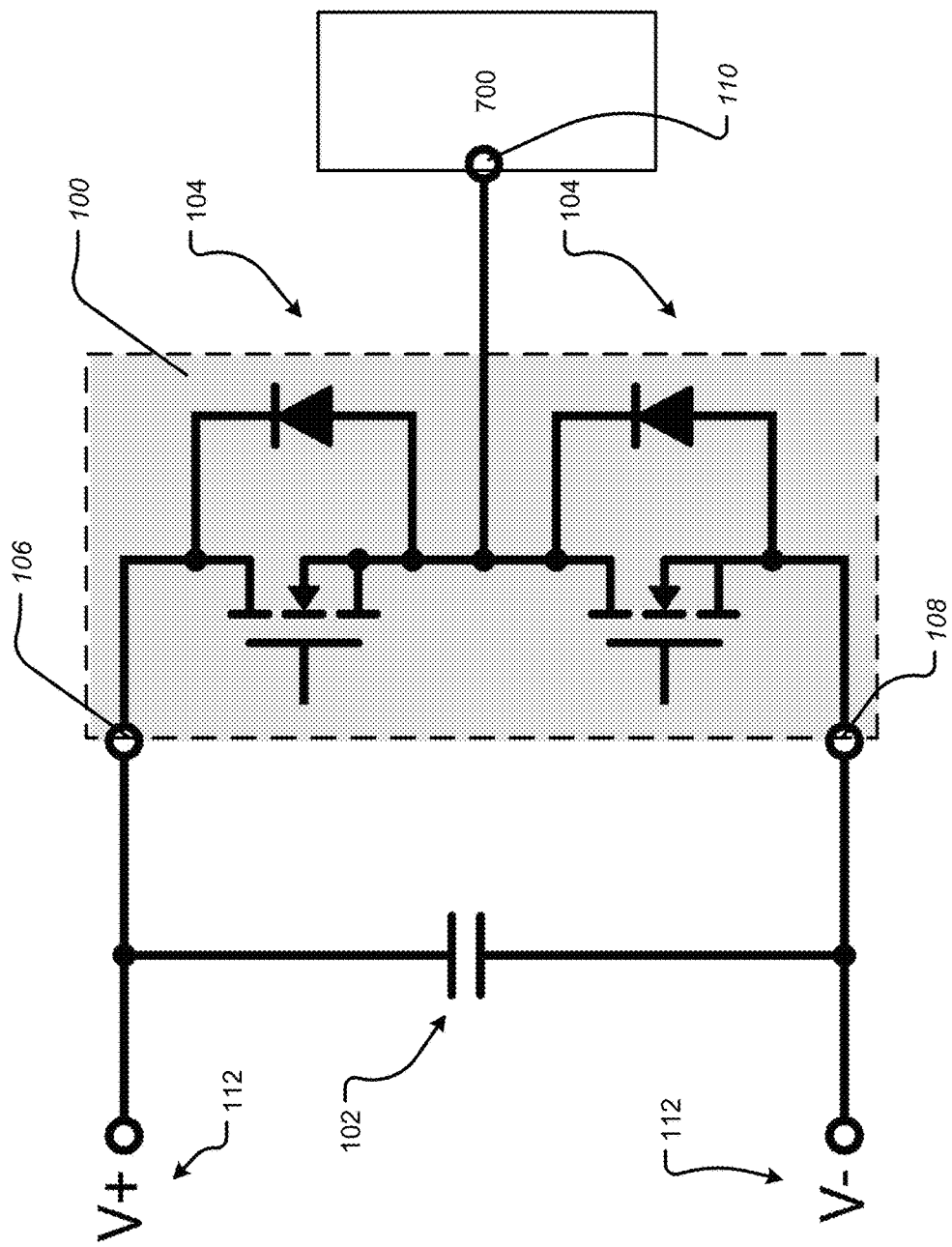
FIG. 1 schematically illustrates a half-bridge based topology of a power module according to aspects of the disclosure.

The aspects of the disclosure and the various features and advantageous details thereof are explained more fully with reference to the non-limiting aspects and examples that are described and/or illustrated in the accompanying drawings and detailed in the following description. It should be noted that the features illustrated in the drawings are not necessarily drawn to scale, and features of one aspect may be employed with other aspects as the skilled artisan would recognize, even if not explicitly stated herein. Descriptions of well-known components and processing techniques may be omitted so as to not unnecessarily obscure the aspects of the disclosure. The examples used herein are intended merely to facilitate an understanding of ways in which the disclosure may be practiced and to further enable those of skill in the art to practice the aspects of the disclosure. Accordingly, the examples and aspects herein should not be construed as limiting the scope of the disclosure, which is defined solely by the appended claims and applicable law. Moreover, it is noted that like reference numerals represent similar parts throughout the several views of the drawings.

The disclosure is directed to a power module and a process of implementing a power module having electrical interconnections using mechanical compression fittings. The mechanical compression fittings may be used for electrical contact, power delivery, signal routing, assembly alignment features, and/or the like. The disclosed power module and process of implementing a power module may in some aspects specifically use these features in the context of high power and high voltage modules. The disclosed mechanical compression fittings may use, but are not limited to, a cylinder and pin arrangement for electrical contact. In such aspects, either or both the cylinder, or pin, may be attached to the power substrate, insert molded into the module housing, and/or the like. This reduces assembly part count, reduces the number of processes in manufacturing, provides module assembly alignment features, and/or the like. The disclosed power module and process of implementing a power module may also reduce mechanical stresses from assembly, induced during operations due to a coefficient of thermal expansion (CTE) mismatch, other built in assembly stresses, and/or the like.

Currently electrical interconnection for power modules use various types of soldered, brazed, or welded connections. Also, current power module assembly techniques use dedicated alignment pins or features to accurately place and assemble components in manufacturing. The disclosed power module and process of implementing a power module may implement use of mechanical compression fittings for electrical connection that eliminates and/or greatly reduces the need to incorporate solder, braze, or welding process steps for final electrical connection. The disclosed implementation of mechanical compression fittings of a certain design may also be used as alignment features for various assembly steps. Accordingly, the disclosed power module and process of implementing a power module may eliminate some of the need for dedicated assembly alignment components, tooling, and/or the like. The disclosed power module and process of implementing a power module in some aspects may implement the pin or socket components of the compression fitting such that they may be insert molded into the plastic housing. This further eliminates process assembly steps, opens the door to a fully automated assembly, and/or the like.

The disclosed power module and process of implementing a power module may place the pin component of the compression fitting on the power module substrate. Alternative embodiments may include the use of mechanical compression fittings for interconnection of the power module to an application system. For example, a laminated DC bus work, an application as described herein, and/or the like. Further embodiments include placing the socket component of the compression fitting on the substrate, a lead frame, another module feature, and/or the like.

The applications of the disclosed power module and process of implementing a power module relate, but are not limited to, manufacturing improvements. For example, elimination of numerous solder processes in assembly and combination of alignment pin feature with the electrical connection of the mechanical compression fitting both increase assembly efficiency and lower cost. The disclosed power module and process of implementing a power module may also solve many of the problems with automated assembly of power modules. Elimination of a solder and/or weld step, manual alignment and positioning of housing components, integration of assembled components into a vendor supplied sub-assembly, and/or the like are all manufacturing applications for the disclosed power module and process of implementing a power module.

The power devices of the power module range in structure and purpose. The term 'power device' refers to various forms of transistors and diodes designed for high voltages and currents. The transistors may be controllable switches allowing for unidirectional or bidirectional current flow (depending on device type) while the diodes may allow for current flow in one direction and may not be controllable. The transistor types may include but are not limited to Metal Oxide Field Effect Transistor (MOSFET), a Junction Field Effect Transistor (JFET), Bipolar Junction Transistor (BJT), Insulated Gate Bipolar Transistor (IGBT), and the like.

This disclosure further describes a power module that may include structure optimized for state-of-the-art wide band gap power semiconductor devices such as Gallium Nitride (GaN), Silicon Carbide (SiC), and the like, which are capable of carrying high amounts of currents and voltages and switching at increasingly faster speeds in comparison with established technologies. Conventional power electronic packages are limited in their functionality for these semiconductors, having internal layouts intended for silicon (Si) device technologies.

The power devices may include Wide Band Gap (WBG) semiconductors, including Gallium Nitride (GaN), Silicon Carbide (SiC), and the like, and offer numerous advantages over conventional Silicon (Si) as a material for the power devices. Nevertheless, various aspects of the disclosure may utilize Si type power devices and achieve a number of the benefits described herein. The key metrics of the WBG semiconductors may include one or more of the following non-limiting aspects: Higher voltage blocking, Higher current density, Higher temperature operation, Faster switching, Improved thermal performance, Lower on-resistance (reduced conduction losses), Lower turn-on and turn-off energies (reduced switching losses), and so on. It should be appreciated that these above-noted key metrics of the WBG semiconductors are not required and may not be the implemented in some aspects of the disclosure. To effectively utilize the WBG semiconductor devices, a power module (also referred to as a power package) is employed.

FIG. 1 schematically illustrates a half-bridge based topology of a power module according to aspects of the disclosure.

In particular, FIG. 1 illustrates a power module 100 implemented with a half-bridge based topology that may be considered a fundamental building block in many switching power converters, an application 700 as described herein, and/or the like. For example, the application 700 may use these topologies to connect to a DC supply 112, with DC link capacitors 102 as an intermediate connection between them. However, the power module 100 of the disclosure may be implemented without the DC link capacitors 102.

The application 700 may include any number of applications operating with a power system and/or one or more of the power module 100. In one or more aspects, the application 700 may be a power system, a motor system, a motor drive, an automotive motor system, a charging system, an automotive charging system, a vehicle system, an industrial motor drive, an embedded motor drive, an uninterruptible power supply, an AC-DC power supply, a welder power supply, a military system, an inverter, an inverter for wind turbines, solar power panels, tidal power plants, electric vehicles (EVs), a converter, a solar inverter, a circuit breaker, a protection circuit, a DC-DC converter, an Off-Board DC Fast Charger for an electric vehicle (EV), an on-board DC/DC Converter for an electric vehicle (EV), an on-board battery charger for an electric vehicle (EV), an electric vehicle (EV) Powertrain/Main Inverter, an electric vehicle (EV) charging infrastructure, an electric traction motor, a motor drive for an electric motor, a commercial inductive heating system, an uninterruptible power system, and/or the like.

The DC link capacitors 102 may act to filter ripple on the line and counter the effects of inductance in the current path. Two half-bridges in parallel may form a full-bridge, while three in parallel may form a three-phase topology. The three-phase topology is also often referred to as a six pack, signifying the six switch positions among the three phase legs. Moreover, other topologies are contemplated for the power module including common source, common drain, neutral point clamp, and/or the like.

FIG. 1 further illustrates the power module 100 having one or more switch positions 104. The power module 100 may include a first terminal 106, a second terminal 108, and a third terminal 110. One or more of the first terminal 106, the second terminal 108, and the third terminal 110 may connect to the application 700 and/or DC supply 112.

Figure 2:
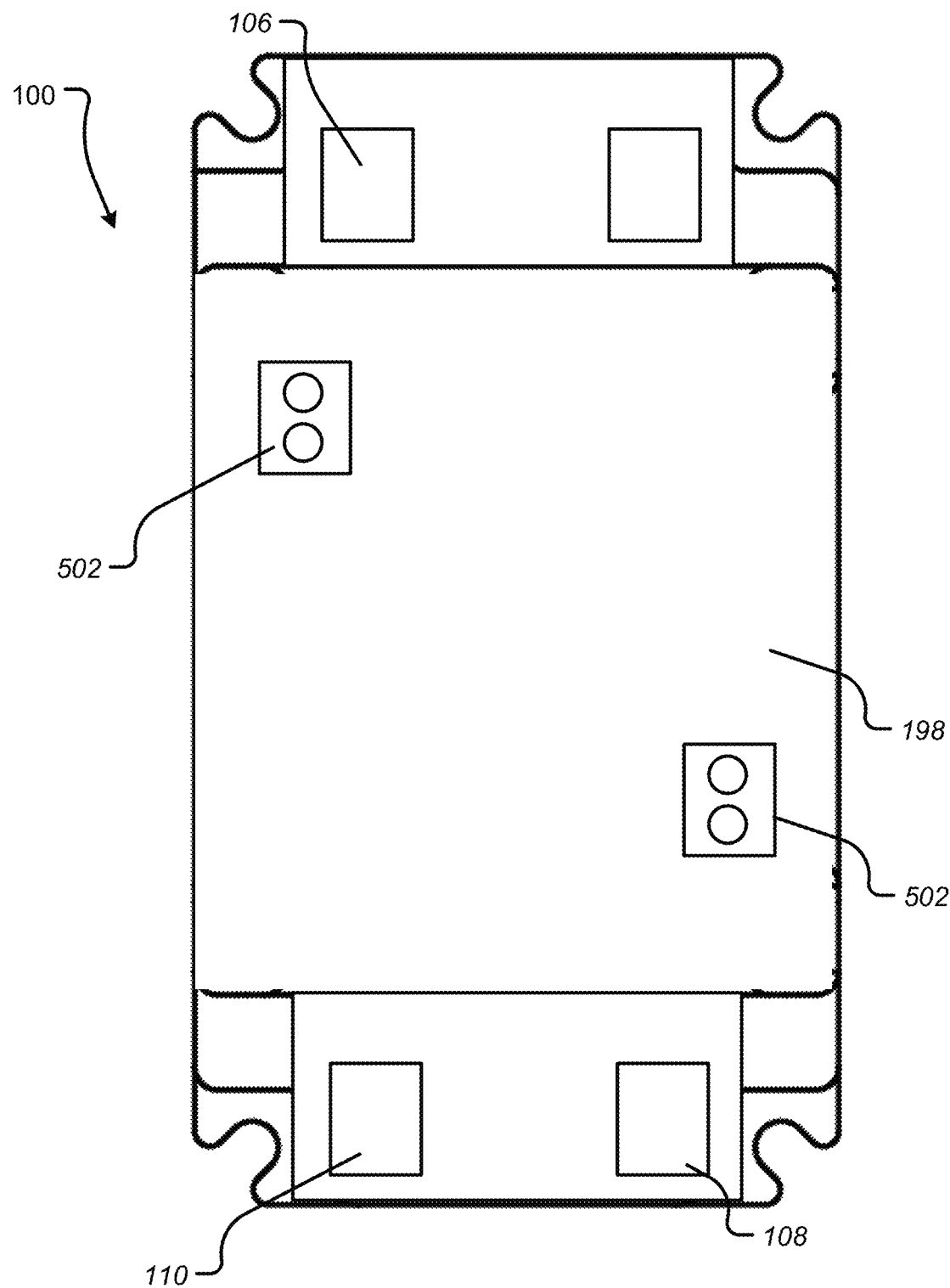
FIG. 2 illustrates a top schematic view of a power module according to an aspect of the disclosure.

FIG. 2 illustrates a top schematic view of a power module according to an aspect of the disclosure.

In particular, a half-bridge configuration of the power module 100 is illustrated in FIG. 2 with the first terminal 106, the second terminal 108, and the third terminal 110 that may be configured with external connections to the DC link capacitors 102, the application 700, and/or the like.

A power terminal pin-out of a single half-bridge configuration of the power module 100 is depicted in FIG. 2. In this regard, the first terminal 106 may be the V+ terminal, the second terminal 108 may be the V− terminal, and the third terminal 110 may be an output terminal. However, the first terminal 106, the second terminal 108, and the third terminal 110 be configured to provide any type of terminal, terminal connection, terminal function, input function, output function, power function, and/or the like.

The power module 100 may include signal terminals 502. The specific pin-out of the signal terminals 502 may be modular and may be modified as necessary. The signal terminals 502 may be implemented by signal pins for differential signal transfer.

Each switch position 104 may utilize a pair of pins with the signal terminals 502 for the gate signal, a source kelvin for optimal control, and/or the like. The other pin pairs of the signal terminals 502 may be used for an internal temperature sensor, overcurrent sensing, for other diagnostic signals, and/or the like. Of course, any number of signal pins and any number of signal terminals may be implemented to provide the functionality as described in conjunction with the disclosure. It is contemplated that more or less pins and/or more or less signal terminals may also be added as needed. In some aspects, the other diagnostic signals may be generated from diagnostic sensors that may include strain gauges sensing vibration, and the like. The diagnostic sensors can also determine humidity. Moreover, the diagnostic sensors may sense any environmental or device characteristic.

Figure 3:
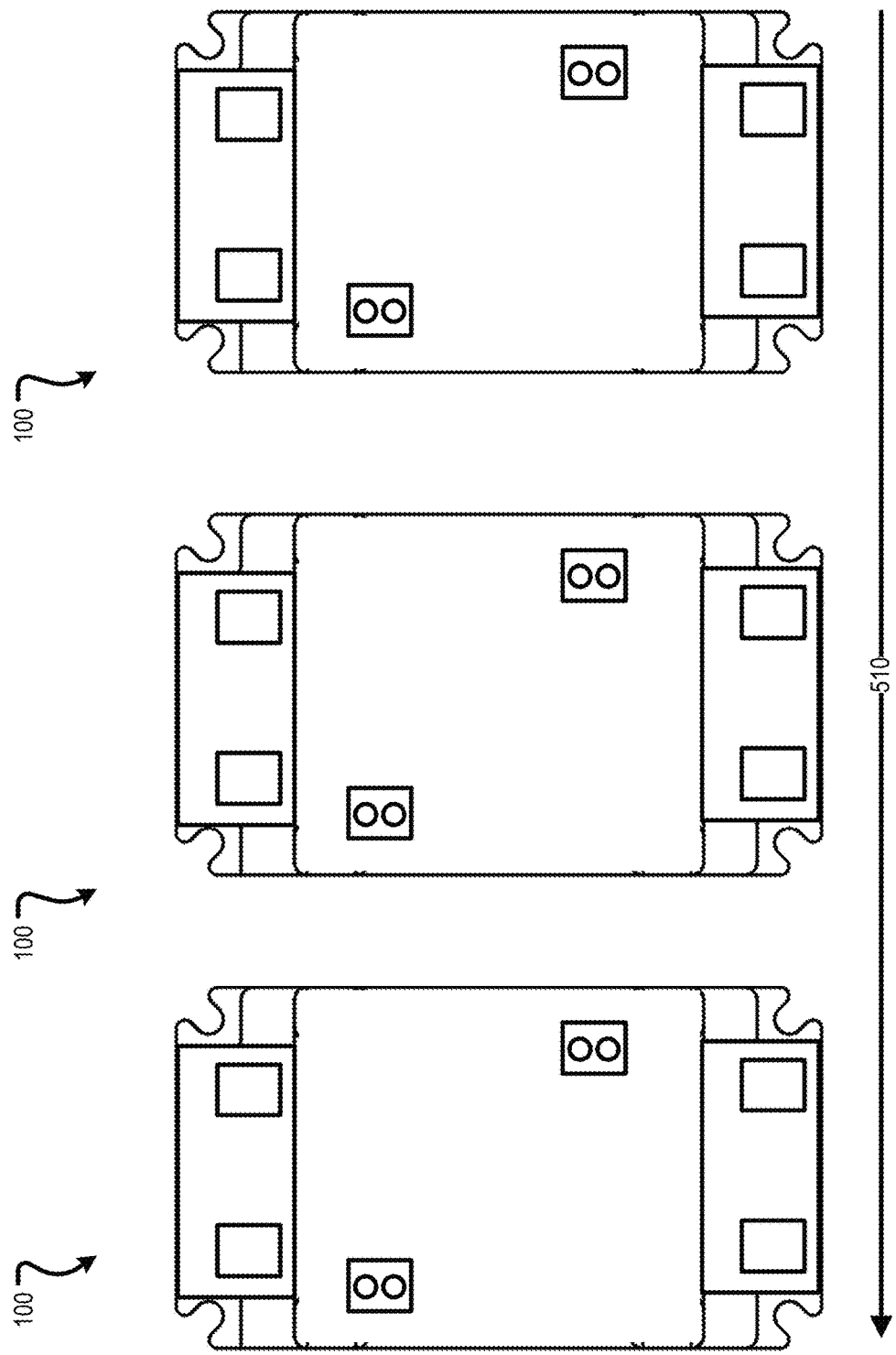
FIG. 3 illustrates a plurality of single phase modules in a paralleled configuration according to aspects of the disclosure.

FIG. 3 illustrates a plurality of single phase modules in a paralleled configuration according to aspects of the disclosure.

In this regard, the power module 100 may be configured such that modularity is fundamental. A single-phase configuration of the power module 100 may be easily paralleled to reach higher currents. As is illustrated in FIG. 3, three power modules 100 are illustrated, but there is no limit to how many of the power modules 100 may be configured in this manner. In this regard, an arrow 510 shows that additional configurations of power module 100 may be arranged in parallel. When paralleled, each of the corresponding ones of the first terminal 106, the second terminal 108, and the third terminal 110 may be electrically connected between each of the power modules 100.

FIG. 4A illustrates a first power module configuration according to aspects of the disclosure; and FIG. 4B illustrates a second power module configuration according to aspects of the disclosure.

With reference to FIG. 4A and FIG. 4B, the power module 100 may be configured such that scalability of the disclosed power modules 100 may be utilized. This is depicted in FIG. 4A and FIG. 4B. As shown in FIG. 4B, the power module 100 width may be extended to accommodate more devices for each switch position 104 in comparison to the power module 100 shown in FIG. 4A. It is important to note that the power modules 100 may be as shown in FIG. 3 or may be scaled as shown in FIG. 4B to match most power levels without sacrificing the benefits of this disclosure including, for example, low inductance, clean switching, high power density, and/or the like.

Figure 5:
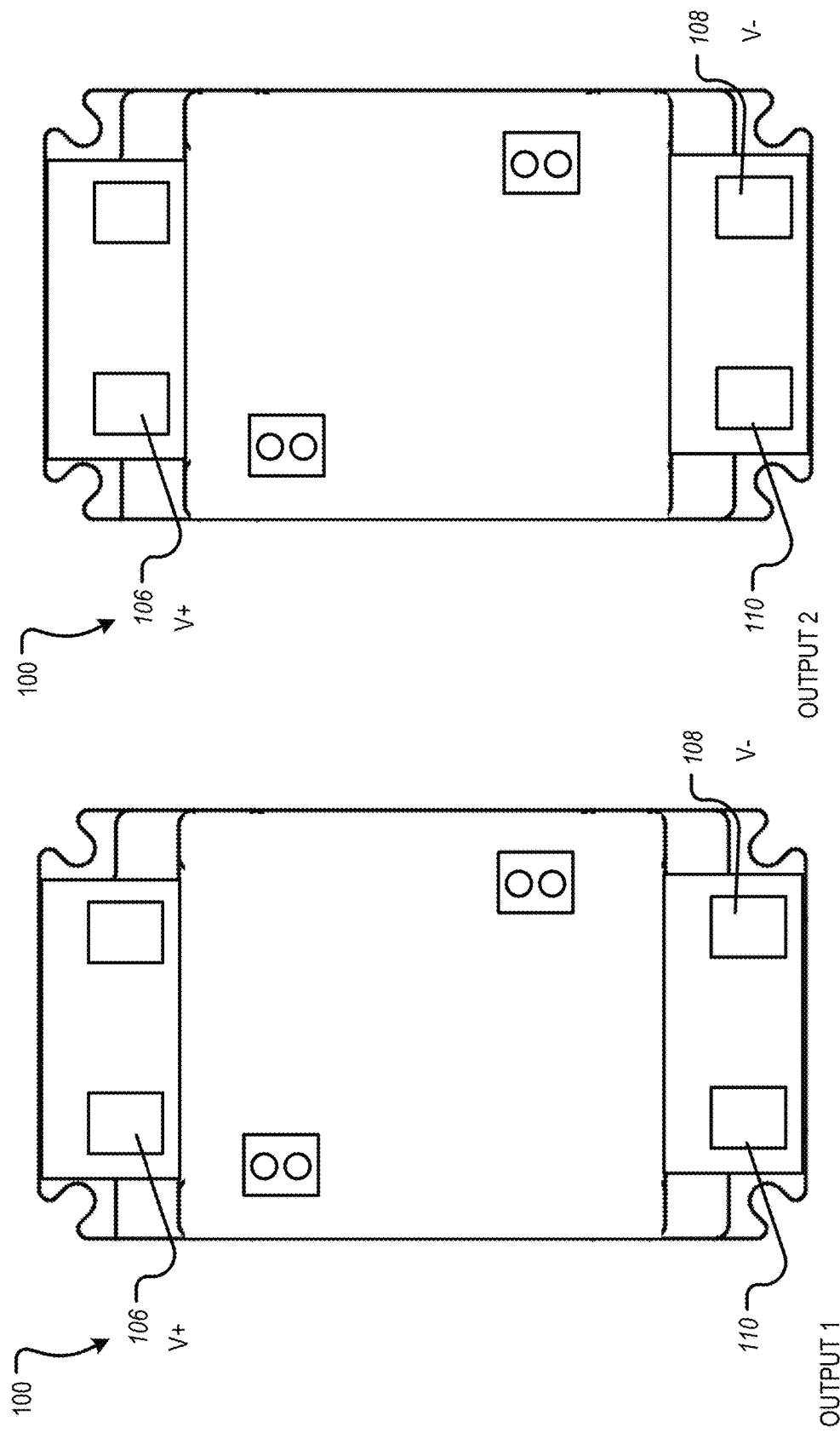
FIG. 5 illustrates a plurality of power modules in a full bridge configuration according to aspects of the disclosure.
Figure 6:
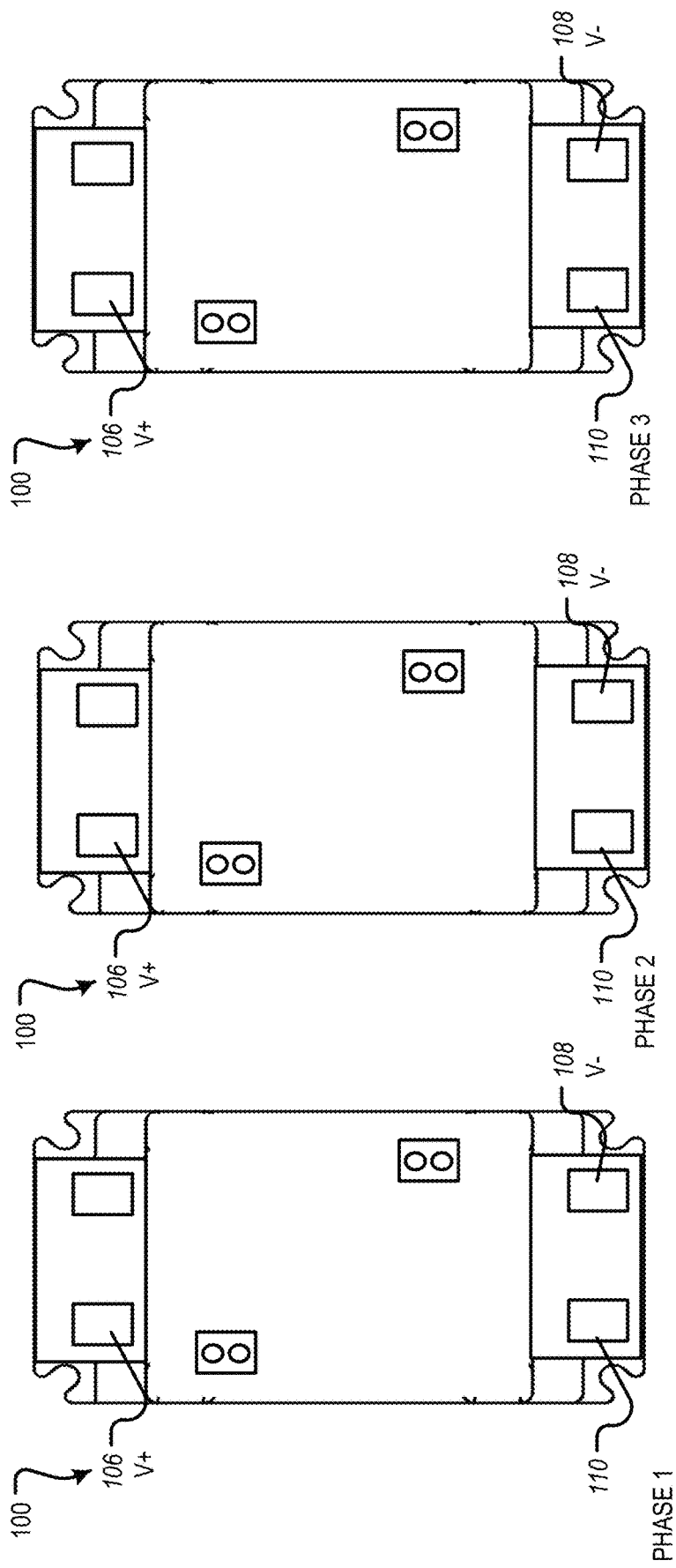
FIG. 6 illustrates a plurality of power modules in a three-phase configuration according to aspects of the disclosure.
Figure 7:
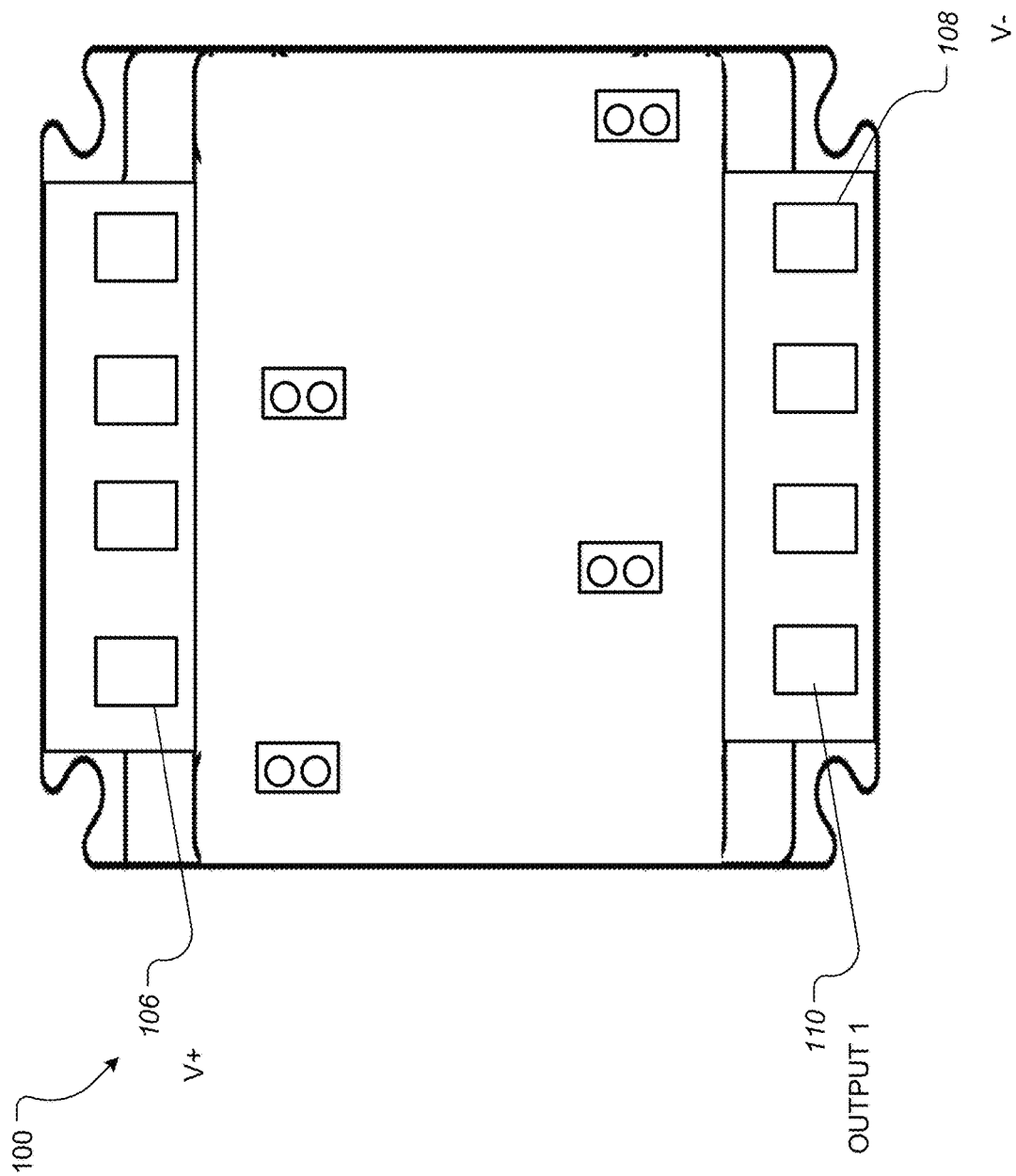
FIG. 7 illustrates a single power module having a full bridge configuration according to aspects of the disclosure.

FIG. 5 illustrates power modules in a full bridge configuration according to aspects of the disclosure; FIG. 6 illustrates a power module in a three-phase configuration according to aspects of the disclosure; and FIG. 7 illustrates a single power module having a full bridge configuration according to aspects of the disclosure.

In some aspects, modularity may also be found in the formation of various electrical topologies, such as FIG. 5 for a full-bridge configuration of two of the power modules 100 and FIG. 6 for a three-phase configuration of three of the power modules 100. For these topologies, the first terminal 106 may function as the V+ terminal, the second terminal 108 may function as V− terminal and may be interconnected while the phase output terminals implemented by the third terminal 110 may remain separate. The configuration of FIG. 5 and FIG. 6 may also be placed in a single housing and may be configured with a shared base plate as illustrated in FIG. 7, which may increase power density with the possible tradeoff of higher unit complexity and cost.

While the various arrangements, configurations, and scaled width versions of the power module 100 cover a range of applications and power levels, the core internal components and layouts may remain identical, may match, may be duplicated, and/or the like. This reinforces the beneficial modular nature of the disclosed power module 100. This structure encompasses a family of modules showcasing a high level of performance while being easy to use and to grow with a range of customer specific systems.

Figure 8:
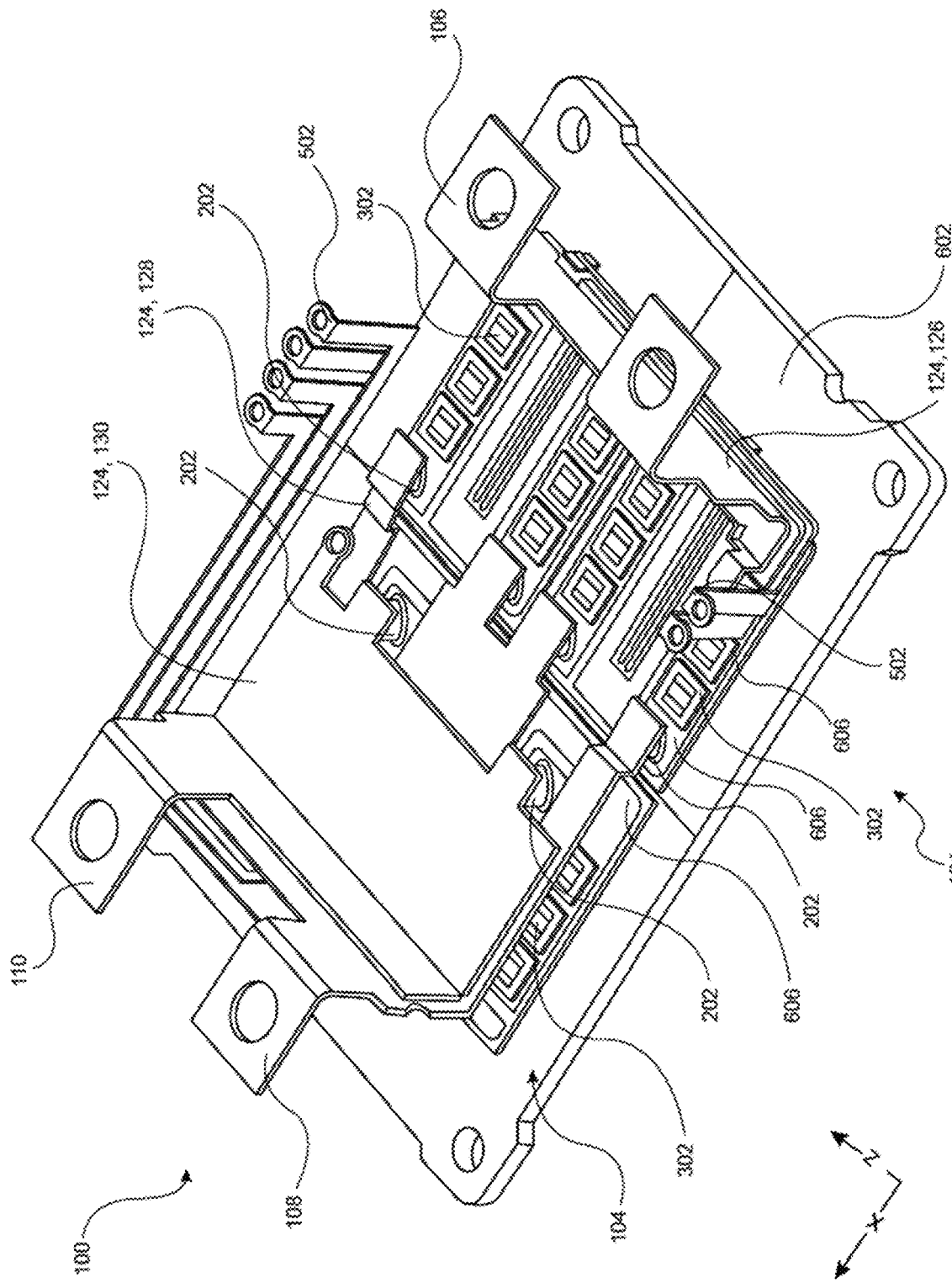
FIG. 8 illustrates a partial perspective internal view of the power module according to aspects of the disclosure.

FIG. 8 illustrates a partial perspective internal view of the power module according to aspects of the disclosure.

Figure 9:
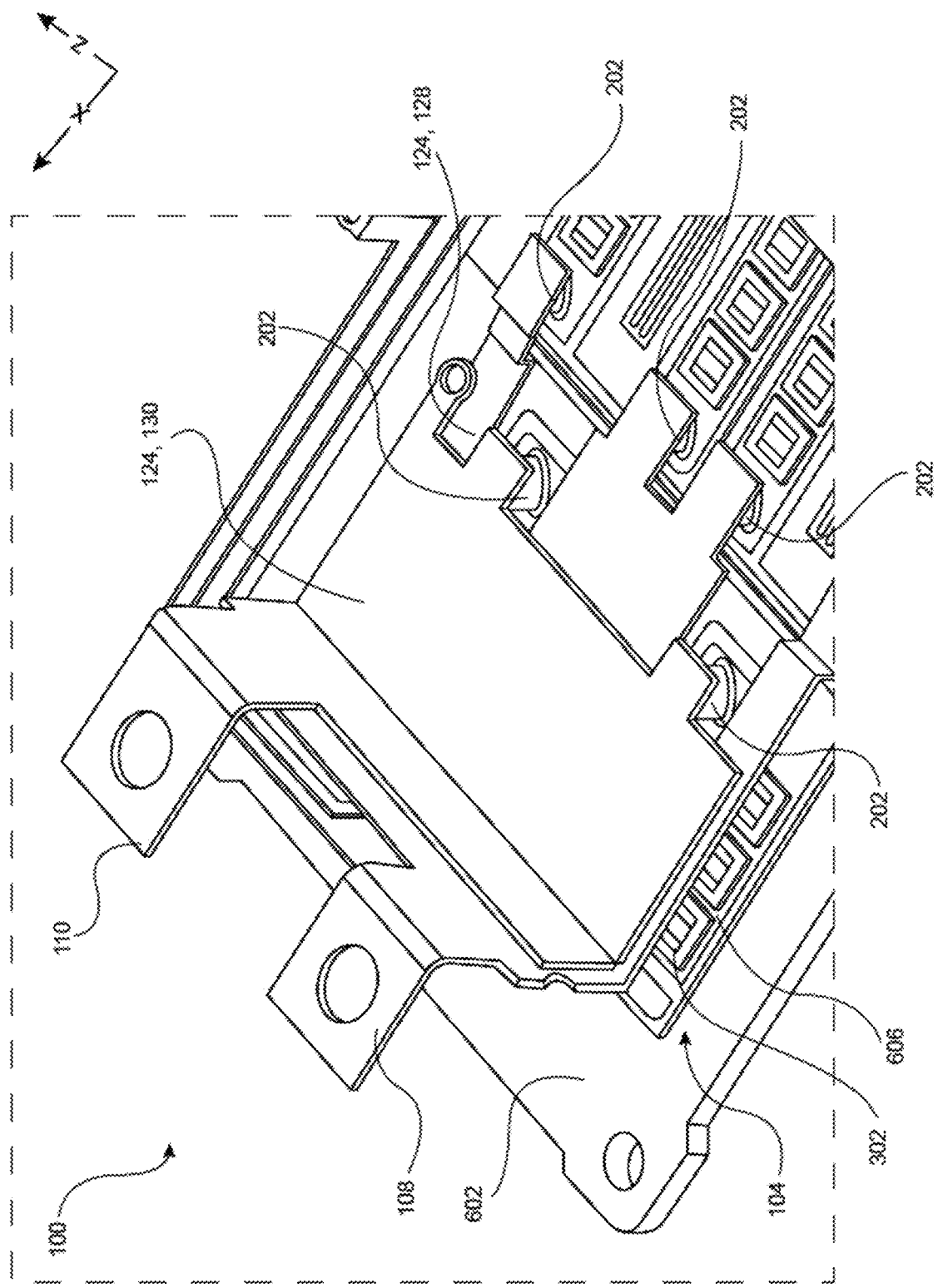
FIG. 9 illustrates a more detailed partial perspective internal view of the power module of FIG. 8.

FIG. 9 illustrates a more detailed partial perspective internal view of the power module of FIG. 8.

Figure 10:
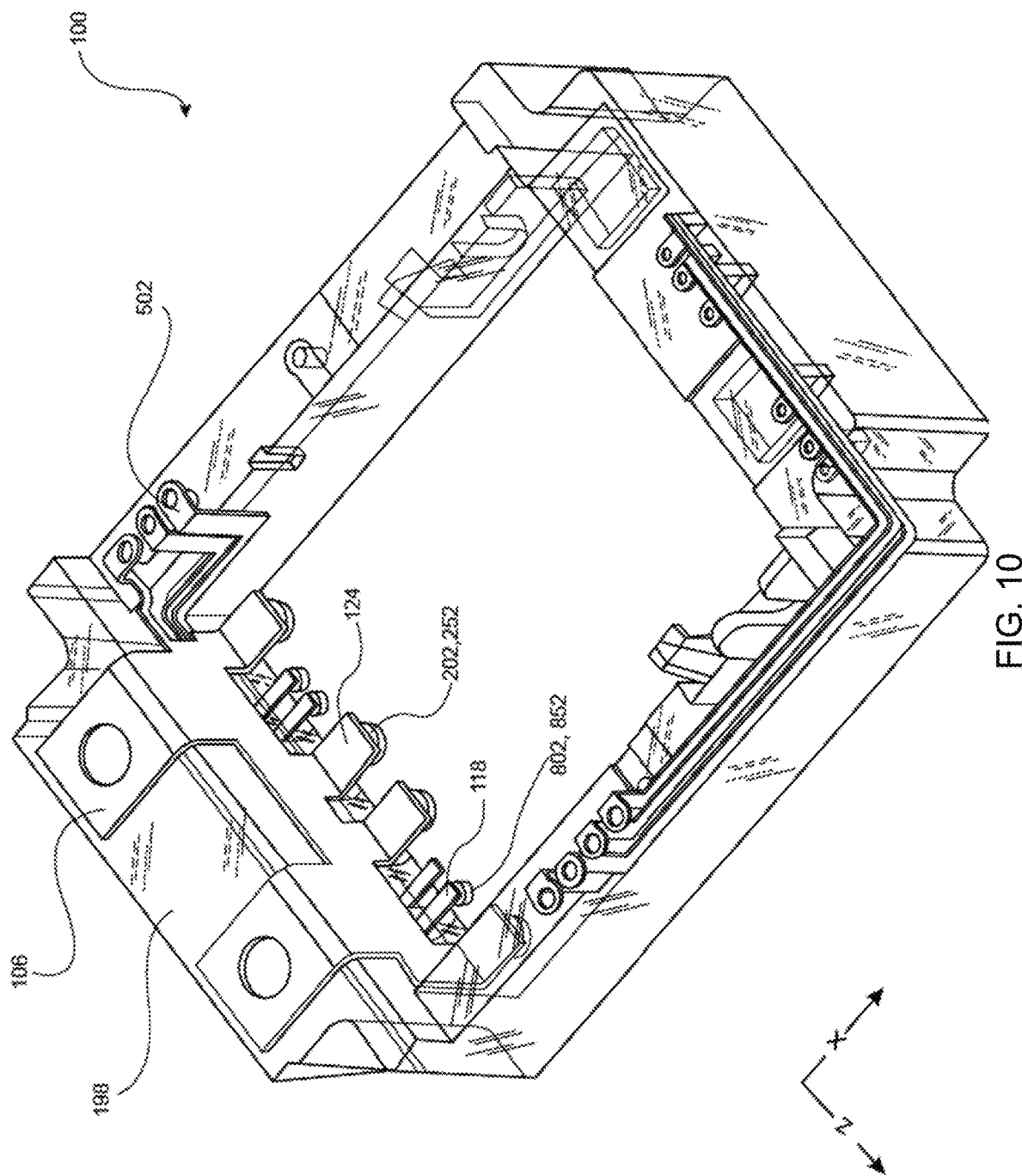
FIG. 10 illustrates a partial perspective side view of limited components of the power module of FIG. 8.

FIG. 10 illustrates a partial perspective side view of limited components of the power module of FIG. 8.

Figure 11:
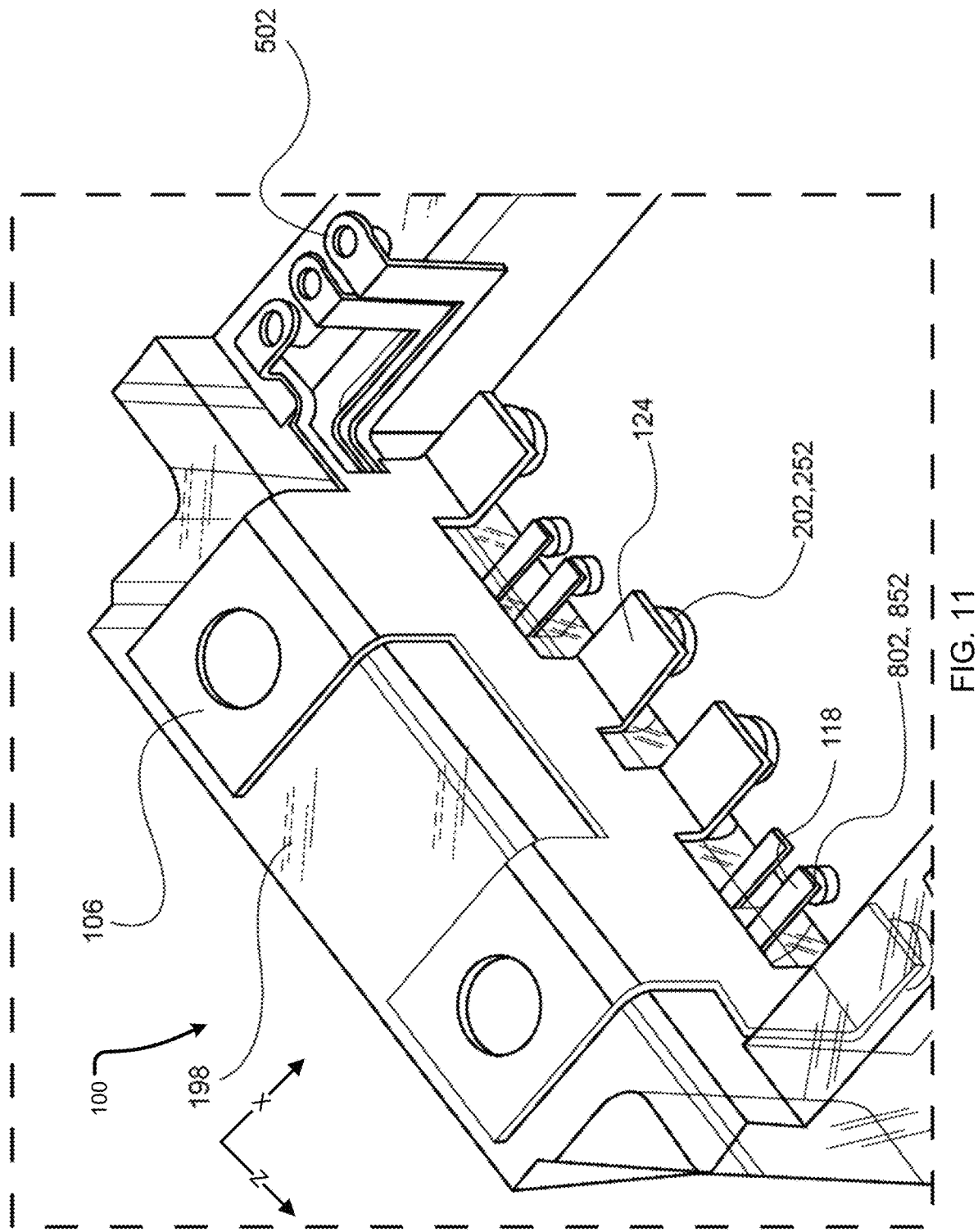
FIG. 11 illustrates a more detailed partial internal view of limited components of the power module of FIG. 10.

FIG. 11 illustrates a more detailed partial internal view of limited components of the power module of FIG. 10.

Figure 12:
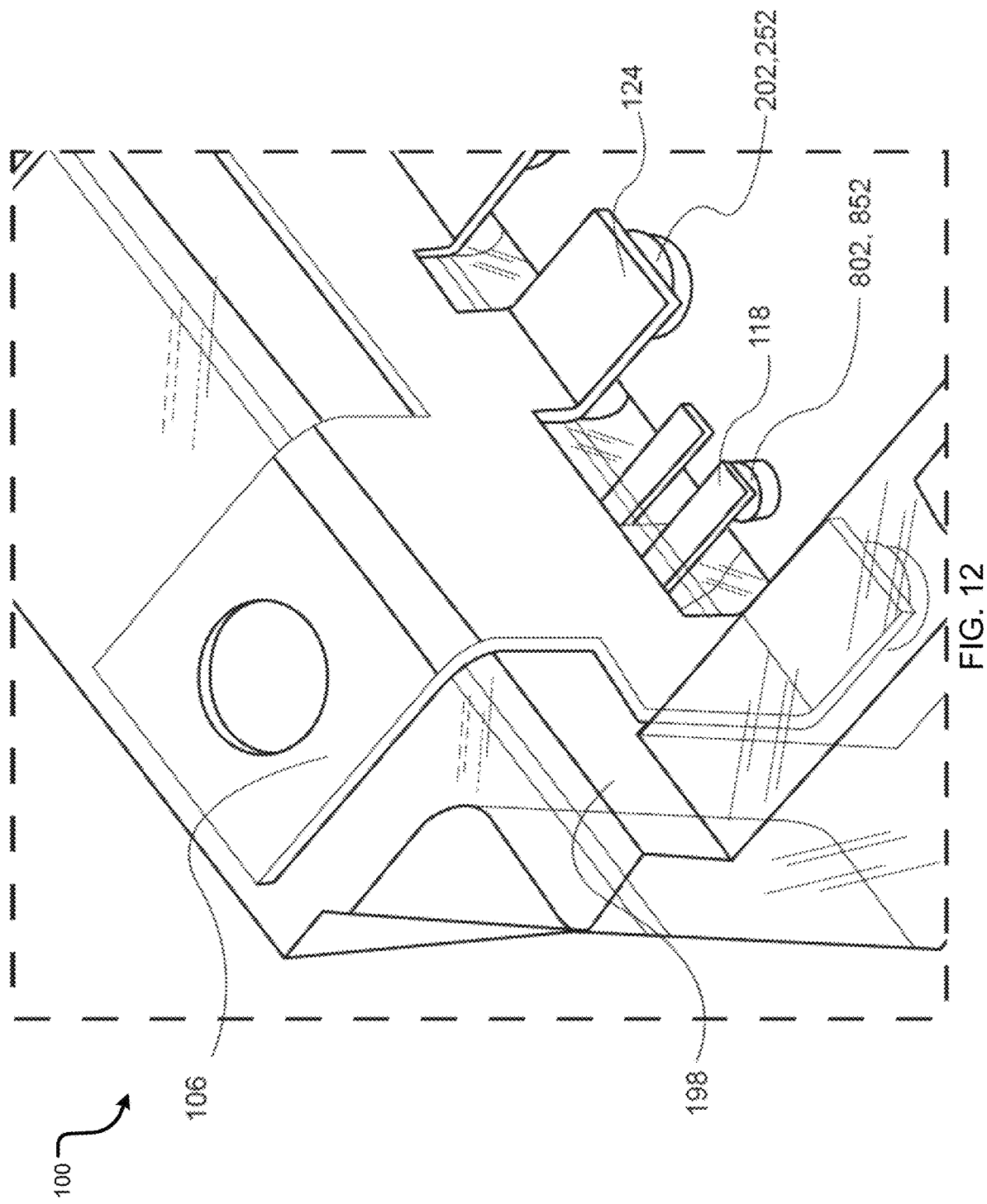
FIG. 12 illustrates a more detailed partial internal view of limited components of the power module of FIG. 10.

FIG. 12 illustrates a more detailed partial internal view of limited components of the power module of FIG. 10.

Figure 13:
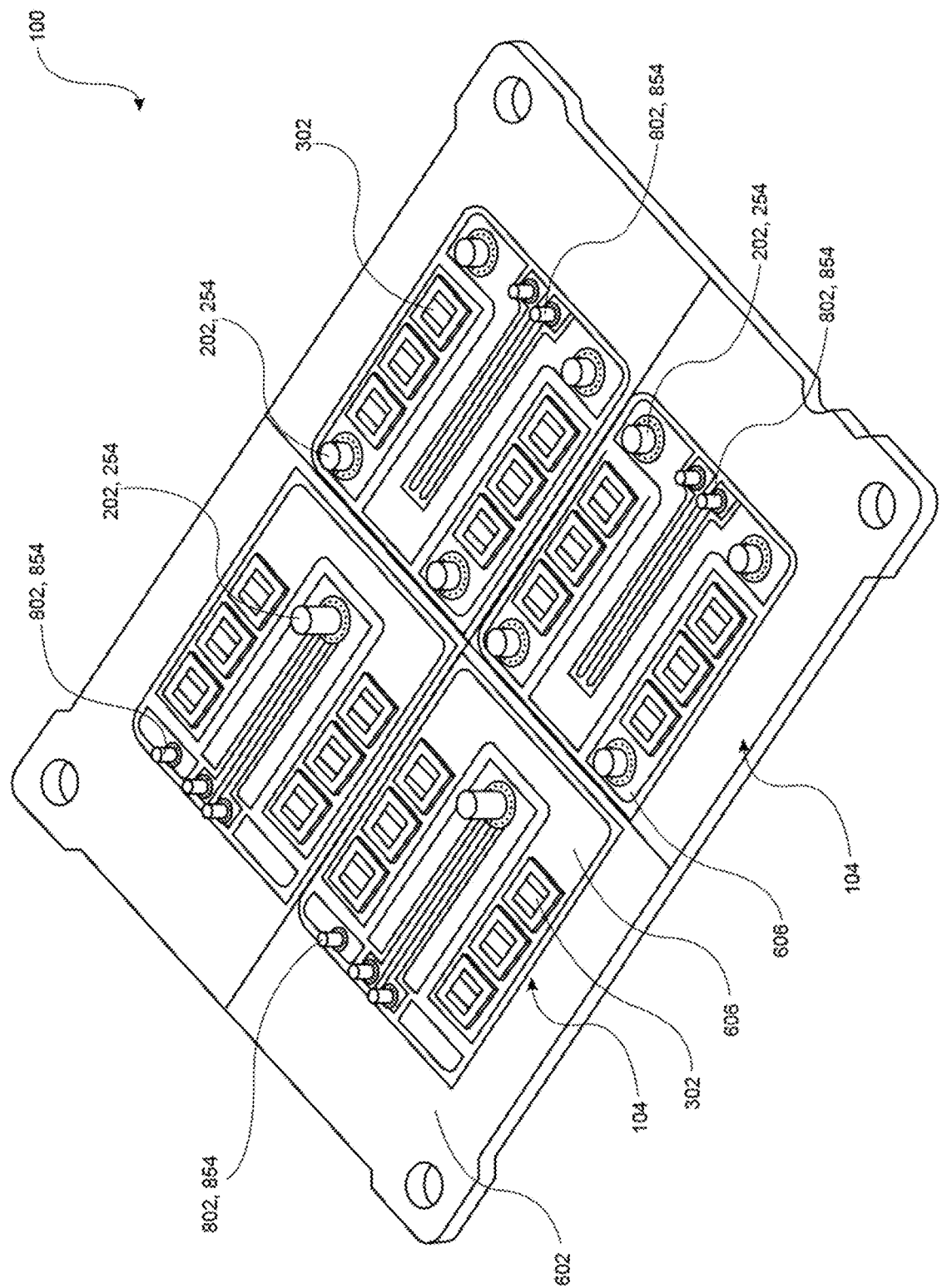
FIG. 13 illustrates a partial internal view of limited components of the power module of FIG. 8.

FIG. 13 illustrates a partial internal view of limited components of the power module of FIG. 8.

Figure 14:
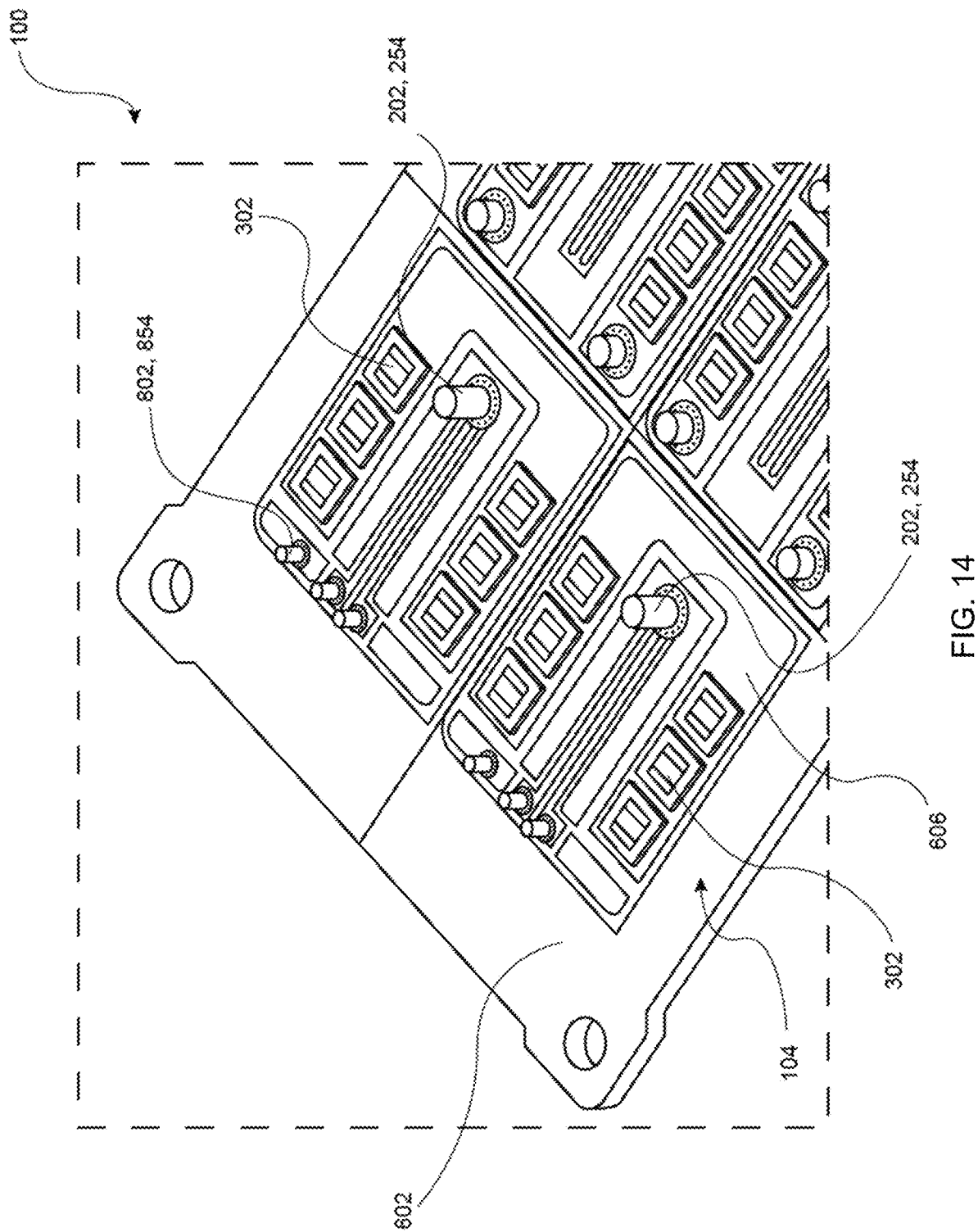
FIG. 14 illustrates a more detailed partial internal view of limited components of the power module of FIG. 13.

FIG. 14 illustrates a more detailed partial internal view of limited components of the power module of FIG. 13.

Figure 15:
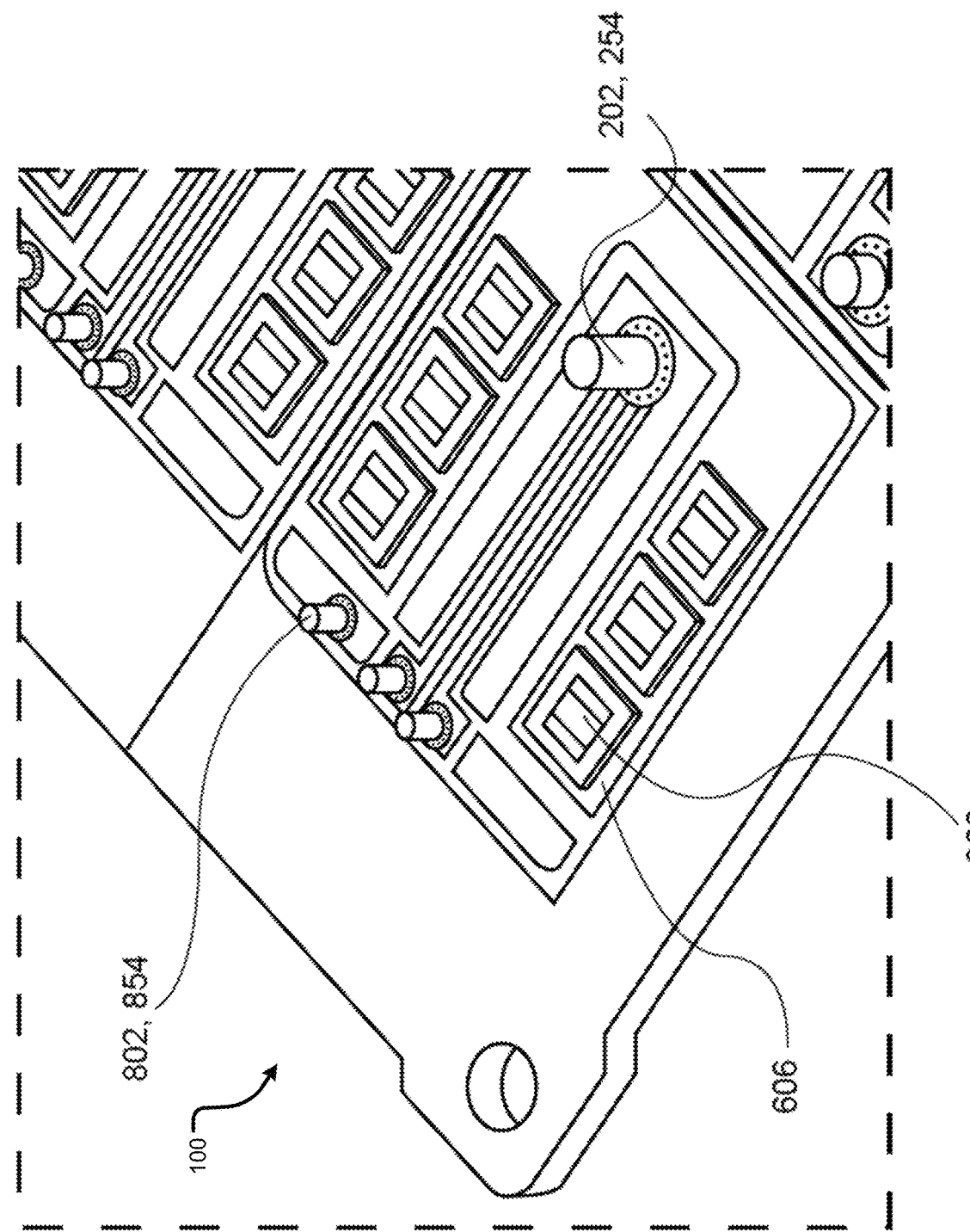
FIG. 15 illustrates a more detailed partial internal view of limited components of the power module of FIG. 13.

FIG. 15 illustrates a more detailed partial internal view of limited components of the power module of FIG. 13.

In particular, FIG. 8 and FIG. 9 illustrate a number of internal elements in the power module 100. The internal elements of the power module 100 may include one or more of a base plate 602, at least one power substrate 606, the first terminal 106, the second terminal 108, the third terminal 110, one or more switch positions 104, the power devices 302, the signal terminals 502, and/or the like. Moreover, it is contemplated that the power module 100 may include more, fewer, or different elements than those illustrated and/or described herein.

Additionally, the power module 100 may include at least one power element 124 and at least one power connector 202 configured to be electrically connected between the power devices 302 and the at least one power element 124. In one aspect, the at least one power connector 202 is configured to be electrically connected between the at least one power substrate 606 and the at least one power element 124. As further described herein, the at least one power connector 202 may be used for electrical contact, power delivery, signal routing, assembly alignment, mechanical connection, and/or the like. This reduces assembly part count, reduces the number of processes in manufacturing, simplifies assembly, and/or the like for the power module 100. The at least one power connector 202 may also reduce mechanical stresses from assembly, induced during operations due to a coefficient of thermal expansion (CTE) mismatch, other built in assembly stresses, and/or the like.

In one aspect, the at least one power connector 202 may be connected up from the at least one power substrate 606 to a layer of metal implemented by the at least one power element 124 above the power devices 302. Additionally, the at least one power element 124 may be connected to the first terminal 106, the second terminal 108, or the third terminal 110 of the power module 100. More specifically, the at least one power connector 202 may electrically connect between the at least one power element 124 and the at least one power substrate 606. Additionally, the at least one power substrate 606 may be electrically connected to the power devices 302.

In one aspect, the at least one power connector 202 may connect directly to the at least one power element 124. In one aspect the at least one power connector 202 may connect to the at least one power element 124 through intervening structures. In one aspect, the at least one power connector 202 may connect directly to the at least one power substrate 606. In one aspect the at least one power connector 202 may connect to the at least one power substrate 606 through intervening structures.

In particular aspects, the at least one power connector 202 may be a mechanical fitting, such as a mechanical compression fitting, a mechanically compliant fitting, and/or the like that may connect with a sliding action, a snapping action, and/or the like, which connection may be accomplished without additional manufacturing processes. In particular aspects, the at least one power connector 202 may be a blind mate connector that may connect with a sliding action, a snapping action, and/or the like, which connection may be accomplished without additional manufacturing processes. The at least one power connector 202 may have self-aligning features that allows a small misalignment when mating. Further details of the at least one power connector 202 are described herein.

The at least one power connector 202 may be configured to provide a power path between the power devices 302 and the at least one power element 124. The at least one power connector 202 may be configured with a first gender component construction, a second gender component construction, and the first gender component construction may be configured to electrically connect with the second gender component construction. The at least one power connector 202 may be configured such that the first power connector portion and the second power connector portion are configured with different gender component constructions comprising a male component construction and a female component construction.

The at least one power element 124 may include a first power plane element 126, a second power plane element 128, and a third power plane element 130. However, the at least one power element 124 may include any number of elevated power plane elements. In this regard, one or more of the first power plane element 126, the first power plane element 126, and the third power plane element 130 may each include an implementation of one or more of the at least one power connector 202.

In one aspect, the first power plane element 126 may be arranged above a first one of at least one power substrate 606 and/or the first one of the switch positions 104; and the first power plane element 126 may be arranged above a second one of at least one power substrate 606 and/or the second one of the switch positions 104. In one aspect, the at least one power element 124 may include insulating materials, insulating layers, and/or the like.

With reference to FIG. 13, FIG. 14, and FIG. 15 the at least one power connector 202 may include a first power connector portion 254 electrically attached to the at least one power substrate 606. In particular, the first power connector portion 254 may be attached to the at least one power substrate 606 with ultrasonic welding, reflow solder, brazing, a swage type connection and/or the like.

In one aspect, the first power connector portion 254 may be attached to the at least one power substrate 606 with a swage type connection that may utilize self-clinching, broaching, flaring, surface mount, weld technology, and/or the like to provide strong, reusable, and/or permanent threads, mounting points, and/or the like. In one aspect, a swage nut, self-clinching nut, and/or the like may use a nut, a threaded insert, and/or the like on the at least one power substrate 606. This construction may anchor the first power connector portion 254 by swaging the surrounding material of the at least one power substrate 606. The first power connector portion 254 may plastically deform (swage) into the at least one power substrate 606.

FIG. 10, FIG. 11, and FIG. 12 illustrate the power module 100 without the at least one power substrate 606, the power devices 302, and the at least one power element 124 for ease of understanding. With reference to FIG. 10, FIG. 11, and FIG. 12 the at least one power connector 202 may include a second power connector portion 252 electrically attached to the at least one power element 124. In particular, the second power connector portion 252 may be attached to the at least one power element 124 with ultrasonic welding, reflow solder, brazing, a swage type connection and/or the like.

In one aspect, the second power connector portion 252 may be attached to the at least one power element 124 with a swage type connection that may utilize self-clinching, broaching, flaring, surface mount, weld technology, and/or the like to provide strong, reusable, and/or permanent threads, mounting points, and/or the like. In one aspect, a swage nut, self-clinching nut, and/or the like may use a nut, a threaded insert, and/or the like on the at least one power element 124. This construction may anchor the second power connector portion 252 by swaging the surrounding material of the at least one power element 124. The second power connector portion 252 may plastically deform (swage) into the at least one power element 124.

Additionally, as illustrated in FIG. 10, FIG. 11, and FIG. 12 the power module 100 may include at least one signal element 118. In various aspects, the power module 100 may include implementations that include the at least one power element 124 without an implementation of the at least one signal element 118; the power module 100 may include implementations that include an implementation of the at least one signal element 118 without the at least one power element 124; and the power module 100 may include implementations that include the at least one signal element 118 and the at least one power element 124.

Additionally, the power module 100 may include at least one signal connector 802 configured to be electrically connected between the power devices 302 and the at least one signal element 118. In one aspect, the at least one signal connector 802 is configured to be electrically connected between the at least one power substrate 606 and the at least one signal element 118. As further described herein, the at least one signal connector 802 may be used for electrical contact, power delivery, signal routing, assembly alignment features, and/or the like. This reduces assembly part count, reduces the number of processes in manufacturing, simplifies assembly, and/or the like for the power module 100. The at least one signal connector 802 may also reduce mechanical stresses from assembly, induced during operations due to a coefficient of thermal expansion (CTE) mismatch, other built in assembly stresses, and/or the like.

In one aspect, the at least one signal connector 802 may be connected up from the at least one power substrate 606 to a layer of metal implemented by the at least one signal element 118 above the power devices 302, which may in turn may be connected to the signal terminals 502 of the power module 100. More specifically, the at least one signal connector 802 may electrically connect between the at least one signal element 118 and the at least one power substrate 606. Additionally, the at least one power substrate 606 may be electrically connected to the power devices 302.

In one aspect, the at least one signal connector 802 may connect directly to the at least one signal element 118. In one aspect the at least one signal connector 802 may connect to the at least one signal element 118 through intervening structures. In one aspect, the at least one signal connector 802 may connect directly to the at least one power substrate 606. In one aspect the at least one signal connector 802 may connect to the at least one power substrate 606 through intervening structures.

In particular aspects, the at least one signal connector 802 may be a mechanical fitting, such as a mechanical compression fitting, a mechanically compliant fitting, and/or the like that may connect with a sliding action, a snapping action, and/or the like, which connection may be accomplished without additional manufacturing processes. In particular aspects, the at least one signal connector 802 may be a blind mate connector that may connect with a sliding action, a snapping action, and/or the like, which connection may be accomplished without additional manufacturing processes. The at least one signal connector 802 may have self-aligning features that allows a small misalignment when mating. Further details of the at least one signal connector 802 are described herein. The at least one signal connector 802 may be configured to provide a signal path between the power devices 302 and the at least one signal element 118. The at least one signal connector 802 may be configured with a first gender component construction, a second gender component construction, and the first gender component construction may be configured to electrically connect with the second gender component construction. The at least one signal connector 802 may be configured such that the first power connector portion and the second power connector portion are configured with different gender component constructions comprising a male component construction and a female component construction.

With reference to FIG. 13, FIG. 14, and FIG. 15 the at least one signal connector 802 may include a first signal connector portion 854 electrically attached to the at least one power substrate 606. In particular, the first signal connector portion 854 may be attached to the at least one power substrate 606 with ultrasonic welding, reflow solder, brazing, a swage type connection and/or the like.

In one aspect, the first signal connector portion 854 may be attached to the at least one power substrate 606 with a swage type connection that may utilize self-clinching, broaching, flaring, surface mount, weld technology, and/or the like to provide strong, reusable, and/or permanent threads, mounting points, and/or the like. In one aspect, a swage nut, self-clinching nut, and/or the like may use a nut, a threaded insert, and/or the like on the at least one power substrate 606. This construction may anchor the first signal connector portion 854 by swaging the surrounding material of the at least one power substrate 606. The first signal connector portion 854 may plastically deform (swage) into the at least one power substrate 606.

With reference to FIG. 10, FIG. 11, and FIG. 12 the at least one signal connector 802 may include a second signal connector portion 852 electrically attached to the at least one signal element 118. In particular, the second signal connector portion 852 may be attached to the at least one signal element 118 with ultrasonic welding, reflow solder, brazing, a swage type connection and/or the like.

In one aspect, the second signal connector portion 852 may be attached to the at least one signal element 118 with a swage type connection that may utilize self-clinching, broaching, flaring, surface mount, weld technology, and/or the like to provide strong, reusable, and/or permanent threads, mounting points, and/or the like. In one aspect, a swage nut, self-clinching nut, and/or the like may use a nut, a threaded insert, and/or the like on the at least one signal element 118. This construction may anchor the second signal connector portion 852 by swaging the surrounding material of the at least one signal element 118. The second signal connector portion 852 may plastically deform (swage) into the at least one signal element 118.

With reference back to FIG. 10, the power module 100 may further include a housing 198 and/or the like. The housing 198 may be formed of a synthetic material. In one aspect, the housing 198 may be an injection molded plastic element. The housing 198 may provide electrical insulation, voltage creepage and clearance, structural support, and cavities for holding a voltage and moisture blocking encapsulation. In one aspect, the housing 198 may be formed in an injection molding process with reinforced high temperature plastic.

In one aspect, the housing 198 may be formed in an injection molding process with reinforced high temperature plastic together with the at least one signal element 118, the at least one power element 124, the at least one power connector 202, the at least one signal connector 802, and/or the like. In particular, the at least one signal element 118, the at least one power element 124, the at least one power connector 202, and/or the at least one signal connector 802 may be embedded, may be inside, may form part of, and/or the like of the housing 198.

Figure 16:
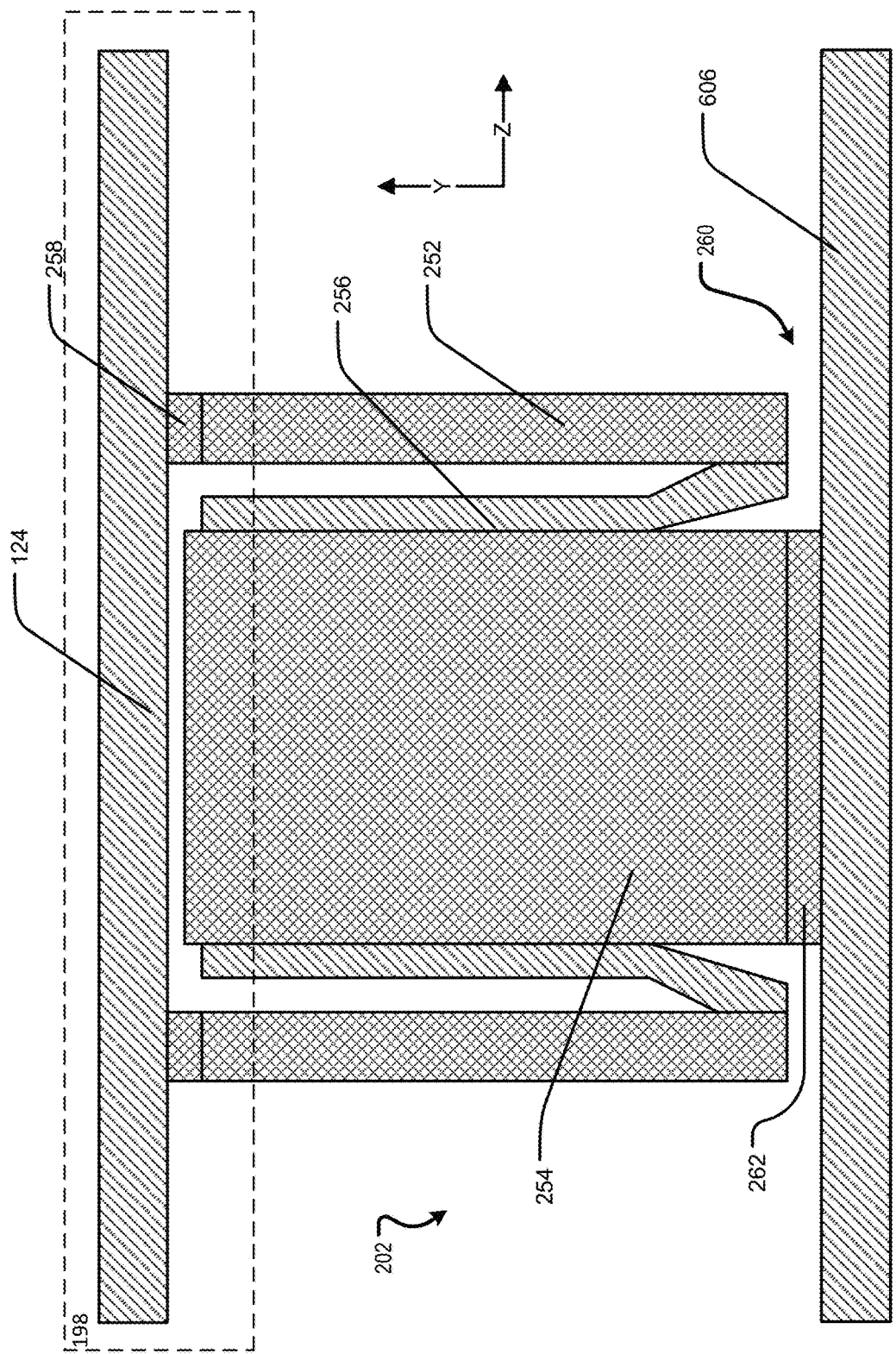
FIG. 16 illustrates an exemplary implementation of at least one power connector according to the disclosure.

FIG. 16 illustrates an exemplary implementation of at least one power connector according to the disclosure.

In particular, FIG. 16 illustrates an exemplary implementation of the at least one power connector 202 that may be implemented as a cylindrical connector socket. The at least one power connector 202 may include the second power connector portion 252 and the first power connector portion 254.

The second power connector portion 252 may be implemented as a cylinder-shaped structure and the first power connector portion 254 may be implemented as a pin shaped structure. However, the second power connector portion 252 and the first power connector portion 254 may be implemented with any shaped structure. More specifically, the second power connector portion 252 and the first power connector portion 254 may each be configured with gender-based constructions that may include male and female constructions for rigid electrical and/or mechanical connection therebetween.

The second power connector portion 252 may include an internal connection structure 256 arranged on an inner wall of the second power connector portion 252. The internal connection structure 256 may be structurally connected to the second power connector portion 252 and may make electrical and/or mechanical connection to the second power connector portion 252. The internal connection structure 256 may include a contact portion in electrical contact with the first power connector portion 254. In particular, the internal connection structure 256 may contact an outer surface of the first power connector portion 254.

The internal connection structure 256 of the second power connector portion 252 may be configured to allow the first power connector portion 254 to move along the Y axis into the second power connector portion 252 to form an electrical connection and/or mechanical connection between one or more of the at least one power element 124, the second power connector portion 252, the internal connection structure 256, the first power connector portion 254, the at least one power substrate 606, and/or the like. Additionally, the construction of the internal connection structure 256 at one end 260 may be wider than a width of the first power connector portion 254 to provide self-aligning between the first power connector portion 254 and the second power connector portion 252. The extensive contact surface between the first power connector portion 254, the second power connector portion 252, and the internal connection structure 256 may increase current capacity, reduce inductance, reduce resistance, and/or the like. The internal connection structure 256 may be implemented as a spring structure such that the spring structure ensures a strong electrical connection and/or a strong mechanical connection between the internal connection structure 256, the second power connector portion 252, and the first power connector portion 254. The first power connector portion 254 may include a connection 262 between the first power connector portion 254 and the at least one power substrate 606. Likewise, the second power connector portion 252 may include a connection 258 between the second power connector portion 252 and the at least one power element 124.

The connection 258 may attach the second power connector portion 252 to the at least one power element 124 with ultrasonic welding, reflow solder, brazing, a swage type connection and/or the like. In one aspect, the second power connector portion 252 may be attached to the at least one power element 124 with a swage type connection that may utilize self-clinching, broaching, flaring, surface mount, weld technology, and/or the like to provide strong, reusable, and/or permanent threads, mounting points, and/or the like. In one aspect, a swage nut, self-clinching nut, and/or the like may use a nut, a threaded insert, and/or the like on the at least one power element 124. This construction may anchor the second power connector portion 252 by swaging the surrounding material of the at least one power element 124. The second power connector portion 252 may plastically deform (swage) into the at least one power element 124.

The connection 262 may attach the first power connector portion 254 to the at least one power substrate 606 with ultrasonic welding, reflow solder, brazing, a swage type connection and/or the like. In one aspect, the connection 262 may be attached to the at least one power substrate 606 with a swage type connection that may utilize self-clinching, broaching, flaring, surface mount, weld technology, and/or the like to provide strong, reusable, and/or permanent threads, mounting points, and/or the like. In one aspect, a swage nut, self-clinching nut, and/or the like may use a nut, a threaded insert, and/or the like on the at least one power substrate 606. This construction may anchor the first power connector portion 254 by swaging the surrounding material of the at least one power substrate 606. The first power connector portion 254 may plastically deform (swage) into the at least one power substrate 606.

In other aspects, the arrangement of the at least one power connector 202 may be reversed with the first power connector portion 254 arranged on the at least one power element 124 and the second power connector portion 252 arranged on the at least one power substrate 606. Additionally, there may be a plurality of the internal connection structure 256 attached to the second power connector portion 252 making electrical connection between the second power connector portion 252 and the first power connector portion 254. Moreover, portions of the at least one power connector 202 may be copper, aluminum, a metal that can provide electrical connection, a metal that has a coefficient of thermal expansion (CTE) consistent with the at least one power substrate 606, Kovar, Copper Molybdenum (CuMo), and/or the like.

Figure 17:
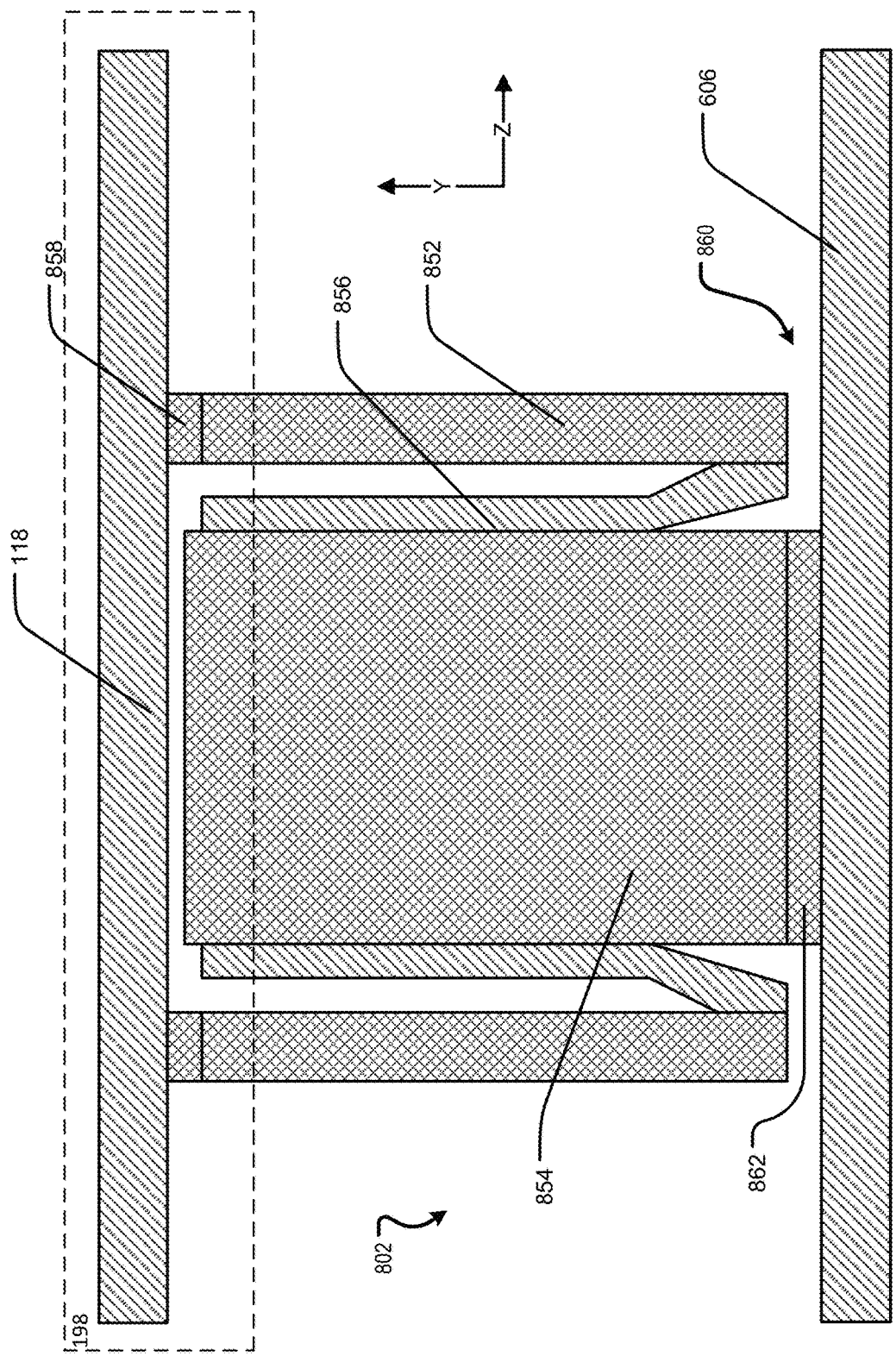
FIG. 17 illustrates an exemplary implementation of at least one signal connector according to the disclosure.

FIG. 17 illustrates an exemplary implementation of at least one signal connector according to the disclosure.

In particular, FIG. 17 illustrates an exemplary implementation of the at least one signal connector 802 that may be implemented as a cylindrical connector socket. The at least one signal connector 802 may include the second signal connector portion 852 and the first signal connector portion 854.

The second signal connector portion 852 may be implemented as a cylinder-shaped structure and the first signal connector portion 854 may be implemented as a pin shaped structure. However, the second signal connector portion 852 and the first signal connector portion 854 may be implemented with any shaped structure. More specifically, the second signal connector portion 852 and the first signal connector portion 854 may each be configured with gender-based constructions that may include male and female constructions for rigid electrical and/or mechanical connection therebetween.

The second signal connector portion 852 may include an internal connection structure 856 arranged on an inner wall of the second signal connector portion 852. The internal connection structure 856 may be structurally connected to the second signal connector portion 852 and may make electrical connection to the second signal connector portion 852. The internal connection structure 856 may include a contact portion in electrical contact with the first signal connector portion 854. In particular, the internal connection structure 856 may contact an outer surface of the first signal connector portion 854.

The internal connection structure 856 of the second signal connector portion 852 may be configured to allow the first signal connector portion 854 to move along the Y axis into the second signal connector portion 852 to form an electrical connection and/or mechanical connection between one or more of the at least one signal element 118, the second signal connector portion 852, the internal connection structure 856, the first signal connector portion 854, the at least one power substrate 606, and/or the like. Additionally, the construction of the internal connection structure 856 at one end 860 may be wider than a width of the first signal connector portion 854 to provide self-aligning between the first signal connector portion 854 and the second signal connector portion 852. The extensive contact surface between the first signal connector portion 854, the second signal connector portion 852, and the internal connection structure 856 may increase current capacity, reduce inductance, reduce resistance, and/or the like. The internal connection structure 856 may be implemented as a spring structure such that the spring structure ensures a strong electrical connection and/or a strong mechanical connection between the internal connection structure 856, the second signal connector portion 852, and the first signal connector portion 854. The first signal connector portion 854 may include a connection 862 between the second signal connector portion 852 and the at least one power substrate 606. Likewise, the second signal connector portion 852 may include a connection 858 between the second signal connector portion 852 and the at least one signal element 118.

The connection 858 may attach the second signal connector portion 852 to the at least one signal element 118 with ultrasonic welding, reflow solder, brazing, a swage type connection and/or the like. In one aspect, the second signal connector portion 852 may be attached to the at least one signal element 118 with a swage type connection that may utilize self-clinching, broaching, flaring, surface mount, weld technology, and/or the like to provide strong, reusable, and/or permanent threads, mounting points, and/or the like. In one aspect, a swage nut, self-clinching nut, and/or the like may use a nut, a threaded insert, and/or the like on the at least one signal element 118. This construction may anchor the second signal connector portion 852 by swaging the surrounding material of the at least one signal element 118. The second signal connector portion 852 may plastically deform (swage) into the at least one signal element 118.

The connection 862 may attach the first signal connector portion 854 to the at least one power substrate 606 with ultrasonic welding, reflow solder, brazing, a swage type connection and/or the like. In one aspect, the connection 862 may be attached to the at least one power substrate 606 with a swage type connection that may utilize self-clinching, broaching, flaring, surface mount, weld technology, and/or the like to provide strong, reusable, and/or permanent threads, mounting points, and/or the like. In one aspect, a swage nut, self-clinching nut, and/or the like may use a nut, a threaded insert, and/or the like on the at least one signal element 118. This construction may anchor the first signal connector portion 854 by swaging the surrounding material of the at least one power substrate 606. The first signal connector portion 854 may plastically deform (swage) into the at least one power substrate 606.

In other aspects, the arrangement of the at least one signal connector 802 may be reversed with the first signal connector portion 854 arranged on the at least one signal element 118 and the second signal connector portion 852 arranged on the at least one power substrate 606. Additionally, there may be a plurality of the internal connection structure 856 attached to the second signal connector portion 852 making electrical connection between the second signal connector portion 852 and the first signal connector portion 854. Moreover, portions of the at least one signal connector 802 may be copper, aluminum, a metal that can provide electrical connection, a metal that has a coefficient of thermal expansion (CTE) consistent with the at least one power substrate 606, Kovar, Copper Molybdenum (CuMo), and/or the like.

In one aspect, the at least one power element 124 may be formed of at least one planar structure that extends the majority of the distance of a width of the power module 100 along the z-axis as illustrated in FIG. 8. In particular aspects, the at least one power element 124 may be formed of at least one planar structure that extends 60%-100%, 60%-70%, 70%-80%, 80%-90%, and/or 90%-100% of the distance of a width of the power module 100 along the z-axis.

In this regard, by placing the at least one power element 124 and the at least one signal element 118 above the power devices 302, area may be freed up on the at least one power substrate 606 to add more power devices, additional components (e.g., thermal sensors, current sensors, capacitors, etc.), larger metal planes to carry more current, easier layout geometries, more flexibility on where parts are placed, and/or the like resulting in a higher density power module package for the power module 100.

In particular, the at least one signal element 118 may include a plurality of the at least one signal element 118. However, the at least one signal element 118 may include any number of signal elements. In one aspect, a first elevated signal element of the at least one signal element 118 may be arranged above a first one of the at least one power substrate 606 and/or a first one of the switch positions 104; and a second elevated signal element of the at least one signal element 118 may be arranged above a second one of the at least one power substrate 606 and/or a second one of the switch positions 104. It should be noted that the relative term "above" as used herein describes a relationship of one element to another element as illustrated in the figures. It will be understood that the relative term "above" is intended to encompass different positions and/or orientations of the elements in addition to the positions and/or orientations depicted in the figures. In this regard, the relative term "above" as used herein may describe a vertical arrangement, a vertical offset, a relative vertical positioning, a spatial arrangement, a spatial offset, a relative spatial positioning, and/or the like of the elements that may not be limited to the orientation depicted in the figures.

One aspect of the disclosure may include a power module 100 where the drain sides of the power devices 302 are connected electrically to a metallization of the at least one power substrate 606 upon which the power devices 302 are mounted. One aspect of the disclosure may include the power module 100 implementing the at least one signal element 118 above, vertically offset, on, directly on, below, directly below, spatially offset, and/or the like the at least one power element 124. It should be noted that the at least one signal element 118 may be a carrier of the Gate-Kelvin auxiliary terminal distribution network.

The integration an elevated implementation of the at least one signal element 118; and an elevated implementation of the at least one power element 124 may simplify the geometry, trace density, and/or increase the utilization of a top conducting ceramic substrate plane of the at least one power substrate 606. This integration may depopulate/remove previously existing low-power and high-power elements from the top metallization plane of the at least one power substrate 606 enabling increased "real estate" for more of the power devices 302. This allows increased ampacity for the same substrate footprint and/or allows the integration of other application circuits, such as temperature sensors, current sensors, etc. This integration may also allow flexibility in routing power and signal paths to the power semiconductor devices since adding one additional dimension (i.e., moving from 2-D to 3-D) enables additional design degrees of freedom.

Additionally, passive devices such as gate or source resistors, capacitors, and/or the like may be implemented utilizing an internal gate-source-Kelvin (GSK) printed circuit board implementation of the at least one signal element 118. Integrating that low-power signal distribution circuit in the at least one signal element 118 directly with a high-power conducting plane of the at least one power element 124 may locate and connect sensors—such as temperature sensors, current sensors, and/or the like.

In one aspect, a thermal sensor may be placed directly on the top of the metallized surface of the at least one power substrate 606 nearest the hottest of the power devices 302 to sense the maximum temperature within the power module.

The at least one signal element 118 may be a small signal circuit board facilitating electrical connection from the at least one signal connector 802, the signal terminals 502, and/or the like to the power devices 302. The at least one signal element 118 may allow for gate and source kelvin connection, as well as connection to additional nodes or internal sensing elements through the at least one signal connector 802.

The at least one signal element 118 may allow for individual gate resistors for each of the power devices 302. The at least one signal element 118 may be a printed circuit board, a ceramic circuit board, a flex circuit board, embedded metal strips, and/or the like arranged in the power module 100. In one aspect, the at least one signal element 118 may include a plurality of assemblies. In one aspect, the at least one signal element 118 may include a plurality of assemblies, one for each switch position 104.

The at least one power element 124 may connect or be part of one of the first terminal 106, the second terminal 108, and/or the third terminal 110. In particular, each of the first terminal 106, the second terminal 108, and/or the third terminal 110 may connect and/or be part of a respective one of the at least one power element 124. In this regard, a respective one of the at least one power element 124 together with a respective one of the first terminal 106, the second terminal 108, and/or the third terminal 110 may create a high current path between an external system and the at least one power substrate 606. In one aspect, the first terminal 106 may connect or be part of the first power plane element 126, the second terminal 108 may be connected or be part of the first power plane element 126, and the third terminal 110 may be connected or be part of the third power plane element 130.

The at least one power element 124 and a respective one of the first terminal 106, the second terminal 108, and/or the third terminal 110 may be fabricated from sheet metal through an etching process, a stamping operation, and/or the like. In one aspect, the at least one power element 124 together with a respective one of the first terminal 106, the second terminal 108, and/or the third terminal 110 may be soldered, ultrasonically welded, or the like directly to the at least one power substrate 606. The at least one power element 124 may have a metal plating, such as nickel, silver, gold, and/or the like to protect the surfaces and improve solder-ability.

For a paralleled array of power devices 302 such as transistors, particularly MOSFETs, the timing and magnitude of the gate currents may be balanced to result in consistent turn-on and turn-off conditions. The at least one signal element 118 of the power module 100 may utilize individual ballasting resistors that may be placed in close proximity to the gate of the power devices 302, only separated by the at least one signal connector 802. These components may be of a low resistance and aid in buffering a current flowing to each individual ones of the power devices 302. These components act to decouple the gates of the power devices 302, preventing oscillations and helping to ensure an equalized turn on signal for the paralleled configurations of the power devices 302. A singular external resistor may be utilized and connected to these paralleled resistors for controlling the turn on speed of the switch position 104.

The at least one signal element 118 may implement the gate resistors in a number of different ways including a surface mount package, an integrated thick film layer, a printed thick film, a wire bondable chip, and/or the like depending on the application.

In particular, the at least one signal element 118 may be connected to the signal terminals 502. These connections may be used for temperature measurement or other forms of internal sensing. In some aspects, the internal sensing may include diagnostic sensing that includes diagnostic signals that may be generated from diagnostic sensors that may include strain gauges sensing vibration, sensors sensing humidity, and the like. Moreover, the diagnostic sensors may sense any environmental or device characteristic.

The power module 100 may include the base plate 602. In one aspect, the base plate 602 may include a metal. In one aspect, the metal may include copper. The base plate 602 may provide structural support to the power module 100 as well as facilitating heat spreading for thermal management of the power module 100. The base plate 602 may include a base metal, such as copper, aluminum, or the like, or a metal matrix composite (MMC) which may provide coefficient of thermal expansion (CTE) matching to reduce thermally generated stress. In one aspect, the MMC material may be a composite of a high conductivity metal such as copper, aluminum, and the like, and either a low CTE metal such as molybdenum, beryllium, tungsten, and/or a non-metal such as diamond, silicon carbide, beryllium oxide, graphite, embedded pyrolytic graphite, or the like. Depending on the material, the base plate 602 may be formed by machining, casting, stamping, or the like. The base plate 602 may have a metal plating, such as nickel, silver, gold and/or the like, to protect surfaces of the base plate 602 and improve solder-ability. In one aspect, the base plate 602 may have a flat backside. In one aspect, the base plate 602 may have a convex profile to improve planarity after reflow. In one aspect, the base plate 602 may have pin fins for direct cooling. In one aspect, the base plate 602 may include insulating materials, insulating layers, and/or the like.

The power module 100 may include the at least one power substrate 606. The at least one power substrate 606 may provide electrical interconnection, voltage isolation, heat transfer, and/or the like for the power devices 302. The at least one power substrate 606 may be constructed as a direct bond copper (DBC), an active metal braze (AMB), an insulated metal substrate (IMS), or the like. In the case of the IMS structure, the at least one power substrate 606 and the base plate 602 may be integrated as the same element. In some aspects, the at least one power substrate 606 may be attached to the base plate 602 with solder, thermally conductive epoxy, sintering and/or the like. In one aspect there may be two of the at least one power substrate 606, one for each switch position 104. In one aspect there may be an implementation of the at least one power substrate 606 and/or a metallized portion of the at least one power substrate 606 for each of the at least one signal connector 802 and the at least one power connector 202.

In one aspect, the at least one power substrate 606 may include insulating materials, insulating layers, and/or the like. In one aspect, an electrically insulating layer that may also be highly thermally conductive may be utilized between the base plate 602 and the at least one power substrate 606 that the power devices 302 are mechanically attached. Additionally, another electrically insulating material may surround the other components of the power module 100.

The power module 100 may include one or more power contacts. A surface of one of the one or more power contacts may form the first terminal 106, the second terminal 108, and/or the third terminal 110. The one or more power contacts may be implemented by the first terminal 106, the second terminal 108, and/or the third terminal 110 and may create a high current path between an external system and the at least one power substrate 606. The one or more edge power contacts implemented by the first terminal 106, the second terminal 108, and/or the third terminal 110 may be fabricated from sheet metal through an etching process, a stamping operation, and/or the like. In one aspect, the one or more edge power contacts implemented by the first terminal 106, the second terminal 108, and/or the third terminal 110 may be connected to the at least one power substrate 606 through the at least one power connector 202. The one or more power contacts implemented by the first terminal 106, the second terminal 108, and/or the third terminal 110 may have a metal plating, such as nickel, silver, gold, and/or the like to protect the surfaces and improve solder-ability.

With reference to FIG. 8, the power devices 302 may be located on the at least one power substrate 606. Additionally, the power devices 302 may include power connections that connect the power devices 302 to the at least one power substrate 606. The upper pads on the power devices 302, including the gate and the source, may be wire bonded to the at least one power substrate 606, which may subsequently connect to one or more of the at least one power connector 202, the at least one power element 124, the at least one signal connector 802, the at least one signal element 118, and/or the like. The signal connections may include aluminum, an aluminum alloy, gold, copper, and/or the like materials implementing a wire construction, a ribbon construction, and/or the like.

The power module 100 may further include one or more switch positions 104. The one or more switch positions 104 may include the power devices 302 that may include any combination of controllable switches and diodes placed in parallel to meet requirements for current, voltage, and efficiency. The power devices 302 may be attached with solder, conductive epoxy, a sintering material, or the like to the at least one power substrate 606.

The upper pads on the power devices 302, including the gate and the source, may be wire bonded to their respective locations with to the at least one power substrate 606. The power connections may include aluminum, an aluminum alloy, gold, copper, and/or the like materials implementing a wire construction, a ribbon construction, and/or the like, which may be ultrasonically welded, or the like at both feet, forming a conductive arch between two metal pads.

In particular, one or more sensors may be arranged on or directly on the at least one power element 124. The one or more sensors may be attached with solder, conductive epoxy, a sintering material, and/or the like, to the at least one power element 124 and then may be connected to the at least one signal element 118 through the at least one signal connector 802.

In one aspect, one or more sensors may be one or more temperature sensors and may be implemented with resistive temperature sensor elements and may be attached directly to the at least one power element 124. In particular, one or more sensors may be arranged on or directly on the at least one power element 124. Other types of temperature sensors are contemplated as well including resistance temperature detectors (RDTs) type sensors, Negative Temperature Coefficient (NTC) type sensors, optical type sensors, thermistors, thermocouples, and the like.

Moreover, one or more sensors may further include one or more diagnostic sensors that may include strain gauges sensing vibration, and the like. The diagnostic sensors can also determine humidity. Moreover, the diagnostic sensors may sense any environmental or device characteristic. One or more sensors may additionally or alternatively be attached directly to the at least one power substrate 606.

The disclosed power modules 100 may include a cold plate. The cold plate may be a high performance liquid cold plate, heat sink, or the like, serving to transfer waste heat away from the power modules 100 to another place (liquid, air, etc.).

For a paralleled array of power devices 302 such as transistors, particularly MOSFETs, the timing and magnitude of the gate currents may be balanced to result in consistent turn-on and turn-off conditions. The power module 100 may utilize individual ballasting resistors that may be placed in close proximity to the gate of the power devices 302, only separated by the gate wire bond. The individual ballasting resistors may be of low resistance and aid in buffering a current flowing to each individual ones of the power devices 302. The individual ballasting resistors act to decouple the gates of the power devices 302, preventing oscillations and helping to ensure an equalized turn on signal for the paralleled configurations of the power devices 302. A singular external resistor may be utilized and connected to these paralleled resistors for controlling the turn on speed of the switch position 104. In one aspect, a ballasting resistor may be associated with each power device 302. In one aspect, an individual ballasting resistor may be associated with each individual ones of the power devices 302.

In additional aspects, the power module 100 may utilize individual ballasting source Kelvin resistors that may be placed in close proximity to the source Kelvin connection of the power devices 302. In one aspect, the source Kelvin resistors may only be separated by the source Kelvin wire bond. In one aspect, a source Kelvin resistor may be associated with each power device 302. In one aspect, an individual source Kelvin resistor may be associated with each individual ones of the power devices 302. The source Kelvin resistors may be of a low resistance and aid in buffering a current flowing to the source Kelvin connection of each of the individual ones of the power devices 302. The source Kelvin resistors may act to decouple the source Kelvin connections of the power devices 302, preventing oscillations and helping to ensure an equalized signal for the paralleled configurations of the power devices 302. In particular aspects, the source Kelvin resistors may be configured and implemented to address any mismatch of the individual ones of the power devices 302, a layout of the individual ones of the power devices 302, and the like.

In particular aspects, the source Kelvin resistors may be configured and implemented to prevent or reduce feedback oscillation between the individual ones of the power devices 302, dampen feedback oscillation between the individual ones of the power devices 302, decouple the source Kelvin signals between the individual ones of the power devices 302, inhibit current flowing between the source Kelvin signals for the individual ones of the power devices 302, equalize current flowing between the source Kelvin signals for the individual ones of the power devices 302, force current flowing through the individual ones of the power devices 302 to flow through a current path, and the like. Moreover, the source Kelvin resistors may reduce signaling inductance, ensure gate operation of the power devices 302 is not slowed, minimize gate/source over-voltage in the power devices 302, and the like.

The source Kelvin resistors may be a surface mount package, an integrated thick film layer, printed thick film, a wire bondable chip, a "natural" resistance path (material/structure interface that adds resistance), or the like depending on the application. In one or more aspects, the resistance value of the source Kelvin resistors and the resistors may be equivalent. In one or more aspects, the resistance value of the source Kelvin resistors and the resistors may be different.

In one aspect, the power module 100 may include a plurality of pin fins. In one aspect, the plurality of pin fins may be configured for transferring heat from one or more components of the power module 100. In one aspect, the plurality of pin fins may be configured for cooling of one or more components of the power module 100. In one aspect, the plurality of pin fins may be configured for direct cooling of one or more components of the power module 100. In one aspect, the plurality of pin fins may be configured for direct cooling of one or more components of the power module 100 in conjunction with a cold plate. In one aspect, the plurality of pin fins may be configured for allowing coolant to pass through the pin fins.

In one aspect, the power module 100 may be inserted into an application 700, implemented with the application 700, configured with the application 700, or the like. The application 700 may be a system implementing the power module 100. The application may be a power system, a motor system, an automotive motor system, a charging system, an automotive charging system, a vehicle system, an industrial motor drive, an embedded motor drive, an uninterruptible power supply, an AC-DC power supply, a welder power supply, military systems, an inverter, an inverter for wind turbines, solar power panels, tidal power plants, and electric vehicles (EVs), a converter, and the like.

In particular, power module 100 may be implemented as a 3-phase inverter. In aspects, the inverter may be configured as two separate 3-phase inverters, one 3-phase inverter, one full-bridge, one half-bridge, and/or the like. In one aspect, the inverter may be configured with six dedicated half bridges. In one aspect, the above-noted configurations may be structured and arranged with connections outside of the inverter. In one aspect, the above-noted configurations may include different versions of the power module 100 and/or other assembly components.

Figure 18:
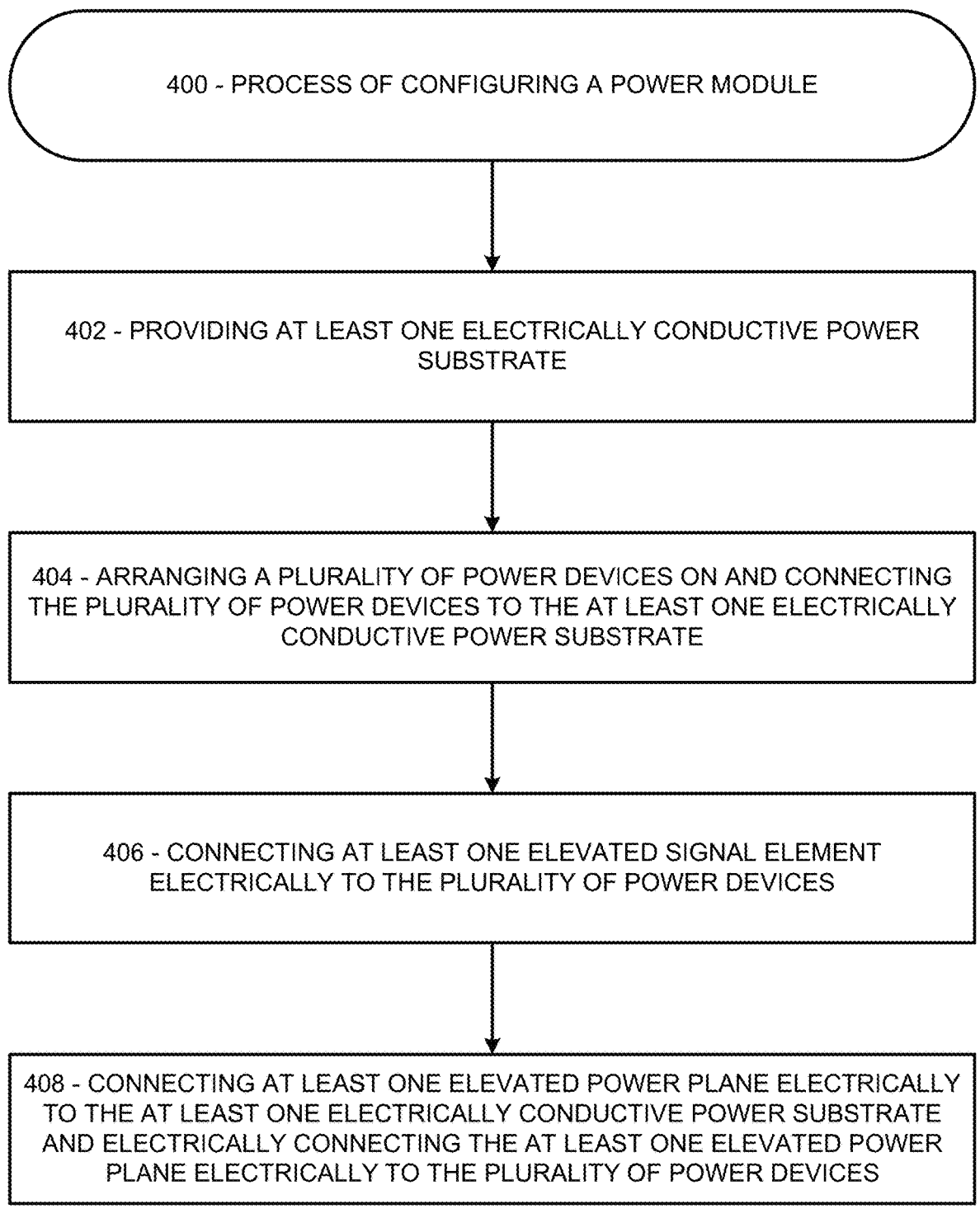
FIG. 18 illustrates a process of implementing a power module according to the disclosure.

FIG. 18 illustrates a process of implementing a power module according to the disclosure.

In particular, FIG. 18 illustrates a process of configuring a power module (box 400) that relates to implementing, making, manufacturing, forming, and/or the like the power module 100 as described herein. In particular, each of the features of the power module 100 as described herein may form part of the process of configuring a power module (box 400). It should be noted that the aspects of process of configuring a power module (box 400) may be performed in a different order consistent with the aspects described herein. Moreover, the process of configuring a power module (box 400) may be modified to have more or fewer processes consistent with the various aspects disclosed herein.

Initially, the process of configuring a power module (box 400) may include providing at least one electrically conductive power substrate (box 402). More specifically, the at least one power substrate 606 may be constructed, configured, and/or arranged as described herein. In particular, the at least one power substrate 606 may include the first signal connector portion 854 and the first power connector portion 254 as described herein. In particular, the first power connector portion 254 and/or the first signal connector portion 854 may be attached to the at least one power substrate 606 with ultrasonic welding, reflow solder, brazing, a swage type connection and/or the like.

The at least one power substrate 606 may provide electrical interconnection, voltage isolation, heat transfer, and the like for the power devices 302. The at least one power substrate 606 may be constructed as a direct bond copper (DBC), an active metal braze (AMB), an insulated metal substrate (IMS), or the like. In some aspects, the at least one power substrate 606 may be attached to the base plate 602 with solder, thermally conductive epoxy, sintering or the like. In one aspect there may be two of the at least one power substrate 606, one for each switch position 104. In one aspect, the at least one power substrate 606 may include insulating materials, insulating layers, and/or the like.

Further, the process of configuring a power module (box 400) may include arranging a plurality of power devices on and connecting the plurality of power devices to the at least one electrically conductive power substrate (box 404). More specifically, the power devices 302 may be constructed, configured, and/or arranged as described herein on the at least one power substrate 606.

The power devices 302 may be attached with solder, conductive epoxy, a sintering material, or the like. The power devices 302 may be distributed about a surface of the at least one power substrate 606 in any arrangement which affords an advantage to a desired property such as heat distribution, power distribution, inductance balancing, and/or similar.

Additionally, the process of configuring a power module (box 400) may include connecting at least one elevated signal element electrically to the plurality of power devices (box 406). More specifically, the at least one signal element 118 and the at least one signal connector 802 may be constructed, configured, and/or arranged as described herein. Additionally, the at least one signal element 118 may be electrically connected to the power devices 302 by the at least one signal connector 802. Moreover, the at least one signal element 118 may be further integrated into the housing 198 as described herein.

Additionally, the process of configuring a power module (box 400) may include connecting at least one elevated power plane electrically to the at least one electrically conductive power substrate and electrically connecting the at least one elevated power plane electrically to the plurality of power devices (box 408). More specifically, the at least one power element 124 and the at least one power connector 202 may be constructed, configured, and/or arranged as described herein. Additionally, the at least one power element 124 may be electrically connected to the at least one power substrate 606 with the at least one power connector 202. Moreover, the at least one power element 124 may be further integrated into the housing 198 as described herein. Additionally, the process of configuring a power module (box 400) may include additional processes consistent with the disclosure including the specification and Figures.

Accordingly, the disclosure has provided implementations of the power module 100 implementing the at least one power connector 202 and/or the at least one signal connector 802 that provide a higher reliability connection in comparison to prior art connection components such as wire bonding. In particular, the disclosed mechanical compression fittings provide a structure and configuration that results in a higher reliability connection. This higher reliability connection was an unexpected result.

Additionally, the disclosure has provided implementations of the power module 100 implementing the at least one power connector 202 and/or the at least one signal connector 802 that provide a lower contact resistance for increased electrical performance in comparison to prior art connection components such as wire bonding. In particular, the disclosed mechanical compression fittings provide a structure and configuration that provide a lower contact resistance for increased electrical performance. This increased electrical performance was an unexpected result.

Additionally, the disclosure has provided implementations of the power module 100 implementing the at least one power connector 202 and/or the at least one signal connector 802 that provide a higher mating cycle durability in comparison to prior art connection components such as wire bonding. In particular, the disclosed mechanical compression fittings provide a structure and configuration that provide a higher mating cycle durability. This higher durability connection was an unexpected result.

Additionally, the disclosure has provided implementations of the power module 100 implementing the at least one power connector 202 and/or the at least one signal connector 802 that provide an interconnect technology that either nullifies or lessens the degrading electrical, thermal, mechanical, and/or the like impact to the power module embedded in applications having significant mechanical shock and vibration loads. In particular, the power module 100 implementing the at least one power connector 202 and/or the at least one signal connector 802 may provide a structure and configuration that either nullifies or lessens the degrading electrical, thermal, mechanical, and/or the like impact to the power module embedded in applications having significant mechanical shock and vibration loads. This higher reliability was an unexpected result.

Additionally, the disclosure has provided implementations of the power module 100 implementing the at least one power connector 202 and/or the at least one signal connector 802 that may increase current capacity. In particular, the at least one power connector 202 and/or the at least one signal connector 802 structured and configured as disclosed may increase current capacity. This higher current capacity was an unexpected result.

Additionally, the disclosure has provided implementations of the power module 100 implementing the at least one power connector 202 and/or the at least one signal connector 802 that reduces a number of wire bonds, which decreases cost, failure modes, increases reliability, and/or the like. In particular, the at least one power connector 202 and/or the at least one signal connector 802 structured and configured as disclosed reduces a number of wire bonds, which decreases cost, failure modes, increases reliability, and/or the like. This was an unexpected result.

Moreover, the at least one power connector 202 and/or the at least one signal connector 802 reduce component stress, provide a strain relief, and/or the like. In particular, the disclosed mechanical compression fittings structured and configured as disclosed reduce component stress, provide a strain relief, and/or the like. This was an unexpected result.

Moreover, the at least one power connector 202 and/or the at least one signal connector 802 provide a smaller and/or more simplified housing. In particular, the at least one power connector 202 and/or the at least one signal connector 802 structured and configured as disclosed provide a smaller and/or more simplified housing. This was an unexpected result.

Moreover, the at least one power connector 202 and/or the at least one signal connector 802 provide both a mechanical and electrical connection. In particular, the disclosed the at least one power connector 202 and/or the at least one signal connector 802 structured and configured as disclosed provide both a mechanical and electrical connection. This was an unexpected result.

Moreover, the at least one power connector 202 and/or the at least one signal connector 802 provide a reduction in manufacturing contaminants such as solder splash and other contaminants reducing a need to clean during the manufacturing process. In particular, the at least one power connector 202 and/or the at least one signal connector 802 structured and configured as disclosed provide a reduction in manufacturing contaminants such as solder splash and other contaminants reducing a need to clean during the manufacturing process. This was an unexpected result.

Additionally, the at least one power connector 202 and/or the at least one signal connector 802 make the connection and/or fitting more reliable. In this regard, previous welding was prone to breaking, disconnecting, and/or the like. This was an unexpected result.

The disclosed power module and process of implementing a power module may be utilized in low-power smaller connections, such as signal connections, that may relate to gate connections, Kelvin connections, sensor connections, such as thermal sensor connections, and/or the like. The disclosed power module and process of implementing a power module may be implemented with connections that may be attached to the substrate with ultrasonic welding, reflow solder, brazing, and/or the like. Also, the connections may be attached using swage type connections that may utilize self-clinching, broaching, flaring, surface mount, weld technology, and/or the like to provide strong, reusable, permanent, and/or the like mounting points.

Additionally, the disclosure has provided implementations of the power module 100 implementing the at least one power connector 202 and/or the at least one signal connector 802 that may be integrated into the housing 198 such as an injection molded housing.

In particular, the disclosed power module 100 may be implemented in numerous topologies including a half-bridge configuration, a full-bridge configuration, a common source configuration, a common drain configuration, a neutral point clamp configuration, and a three-phase configuration. Applications of the power module 100 include motor drives, solar inverters, circuit breakers, protection circuits, DC-DC converters, and the like.

The power module 100 of the disclosure is adaptable for most systems within the power processing needs and size and weight restrictions specific for a given application. The power module design and system level structures described in the disclosure allow for a high level of power density and volumetric utilization to be achieved.

In one aspect, the medium-voltage and high-voltage packages may include one or more of the various aspects of the disclosure. In this regard, the electrical components may be arranged on the at least one power substrate 606. The at least one power element 124 may be arranged over the at least one power substrate 606 and may include the at least one power connector 202 to form power connections to the electrical components that may include the power devices 302. Additionally, the at least one signal element 118 may be arranged over the at least one power substrate 606 and may include the at least one signal connector 802 to form signal connections to the electrical components that may include the power devices 302.

The application 700 which may connect to, may include, and/or the like the power components, the power system, the power module 100, and/or the like may include a power system, a motor system, a motor drive, an automotive motor system, a charging system, an automotive charging system, a vehicle system, an industrial motor drive, an embedded motor drive, an uninterruptible power supply, an AC-DC power supply, a welder power supply, military systems, an inverter, an inverter for wind turbines, solar power panels, tidal power plants, electric vehicles (EVs), a converter, solar inverters, circuit breakers, protection circuits, DC-DC converters, Off-Board DC Fast Chargers for electric vehicles (EVs) and the like, on-board DC/DC Converters for electric vehicles (EVs) and the like, on-board battery chargers for electric vehicles (EVs) and the like, electric vehicle (EV) Powertrains/Main Inverters, electric vehicle (EV) charging infrastructures, electric traction motors, motor drives for electric motors, commercial inductive heating systems, uninterruptible power systems, and/or the like.

For example, the application 700 which may connect to, may include, and/or the like the power components, the power system, the power module 100, and/or the like may be implemented in electric vehicles (EVs) as an on-board DC/DC Converter which may be utilized for powering by diverse voltages—propulsion, HVAC, window lifts, lighting inside and out, infotainment, seat belt sensors, and/or the like. The on-board DC/DC Converter may convert and portion out a correct voltage to each in real time, enabling all systems to work as one.

As another example, the application 700 which may connect to, may include, and/or the like the power components, the power system, the power module 100, and/or the like may be implemented in electric vehicles (EVs) as an Off-Board DC Fast Charger. The off-board charger may convert incoming external alternating current (AC) to the direct current (DC) power mode required by the EV ecosystem and store it in a battery.

As another example, the application 700 which may connect to, may include, and/or the like the power components, the power system, the power module 100, and/or the like may be implemented in electric vehicles (EVs) as an On-Board Battery Charger that may convert DC power from the electric vehicle (EV) battery subsystem into AC power for the main drive motor of the electric vehicles (EVs). When the electric vehicles (EVs) is receiving external power from the grid, the device's rectifier circuitry may convert AC power into DC power to recharge the battery of the electric vehicles (EVs). The system may also harvest kinetic energy created by the momentum of the electric vehicle (EV) through regenerative braking and sends that to the battery as well.

As another example, the application 700 which may connect to, may include, and/or the like the power components, the power system, the power module 100, and/or the like may be implemented in electric vehicles (EVs) as an electric vehicle (EV) Powertrain/Main Inverter. In this regard, the electric vehicle (EV) powertrain may propel the electric vehicle (EV) in conjunction with the EV Powertrain/Main Inverter.

As another example, the application 700 which may connect to, may include, and/or the like the power components, the power system, the power module 100, and/or the like may be implemented in electric vehicle (EV) Charging Infrastructure for electric vehicle (EV) charging stations to deliver more power with lower losses.

As another example, the application 700 which may connect to, may include, and/or the like the power components, the power system, the power module 100, and/or the like may be implemented in an electric traction motor implemented in electric vehicles (EVs), locomotives, roller coasters, other types of transportation, and/or the like that may be configured to control by switching electrical current frequency and voltage and through manipulation of magnetic fields. Such systems may be smaller and lighter than existing systems.

As another example, the application 700 which may connect to, may include, and/or the like the power components, the power system, the power module 100, and/or the like may be implemented in a Motor Drive for Electric motors various transportation systems, factory robots, and the like that may achieve reduction in energy costs, run faster and cooler, and use less energy.

As another example, the application 700 which may connect to, may include, and/or the like the power components, the power system, the power module 100, and/or the like may be implemented in Commercial Inductive Heating system providing the ability to liquify metal, grow semiconductor crystals, ionize plasma, and/or the like by delivering extremely high current and high frequency power switched at exceptionally fast speeds with low conduction loss.

As another example, the application 700 which may connect to, may include, and/or the like the power components, the power system, the power module 100, and/or the like may be implemented in Uninterruptible Power Systems providing a reliable backup power source for any electronic system including standby battery backup power delivery, redundant, double-conversion UPS technologies, and the like that may allow zero transfer time, fewer switching losses, lower system costs, lower operating temperature, and/or the like.

Aspects of the disclosure have been described above with reference to the accompanying drawings, in which aspects of the disclosure are shown. It will be appreciated, however, that this disclosure may, however, be embodied in many different forms and should not be construed as limited to the aspects set forth above. Rather, these aspects are provided so that this disclosure will be thorough and complete, and will fully convey the scope of the disclosure to those skilled in the art. Additionally, the various aspects described may be implemented separately. Moreover, one or more the various aspects described may be combined. Like numbers refer to like elements throughout.

It will be understood that, although the terms first, second, etc. are used throughout this specification to describe various elements, these elements should not be limited by these terms. These terms are only used to distinguish one element from another. For example, a first element could be termed a second element, and, similarly, a second element could be termed a first element, without departing from the scope of the disclosure. The term "and/or" includes any and all combinations of one or more of the associated listed items.

The terminology used herein is for the purpose of describing particular aspects only and is not intended to be limiting of the disclosure. As used herein, the singular forms "a," "an" and "the" are intended to include the plural forms as well, unless the context clearly indicates otherwise. It will be further understood that the terms "comprises" "comprising," "includes" and/or "including" when used herein, specify the presence of stated features, integers, steps, operations, elements, and/or components, but do not preclude the presence or addition of one or more other features, integers, steps, operations, elements, components, and/or groups thereof.

It will be understood that when an element such as a layer, region or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "top" or "bottom" may be used herein to describe a relationship of one element, layer or region to another element, layer or region as illustrated in the figures. It will be understood that these terms are intended to encompass different orientations of the device in addition to the orientation depicted in the figures.

Aspects of the disclosure are described herein with reference to cross-section illustrations that are schematic illustrations of idealized embodiments (and intermediate structures) of the disclosure. The thickness of layers and regions in the drawings may be exaggerated for clarity. Additionally, variations from the shapes of the illustrations as a result, for example, of manufacturing techniques and/or tolerances, are to be expected.

In the drawings and specification, there have been disclosed typical aspects of the disclosure and, although specific terms are employed, they are used in a generic and descriptive sense only and not for purposes of limitation, the scope of the disclosure being set forth in the following claims.

While the disclosure has been described in terms of exemplary aspects, those skilled in the art will recognize that the disclosure can be practiced with modifications in the spirit and scope of the appended claims. These examples given above are merely illustrative and are not meant to be an exhaustive list of all possible designs, aspects, applications or modifications of the disclosure. In this regard, the various aspects, features, components, elements, modules, arrangements, circuits, and the like are contemplated to be interchangeable, mixed, matched, combined, and the like. In this regard, the different features of the disclosure are modular and can be mixed and matched with each other.

What is claimed is:

1. A power package, comprising:
   at least one power substrate;
   a plurality of power devices arranged on the at least one power substrate; and
   a connector configured to be electrically connected to the plurality of power devices; and
   at least one power element configured to conduct current with the plurality of power devices,
   wherein the connector comprises a mechanically compliant fitting;
   wherein the connector comprises a first power connector portion electrically connected to the at least one power substrate;
   wherein the at least one power substrate is configured to provide electrical interconnection, voltage isolation, and/or heat transfer for the plurality of power devices;
   wherein the connector comprises a power connector that is further configured to be electrically connected between the plurality of power devices and the at least one power element;
   wherein the power connector comprises a second power connector portion electrically connected to the at least one power element; and
   wherein the at least one power element is connected to at least one power terminal.

2. The power package of claim 1, wherein:
   the connector further comprises a signal connector that is configured to be electrically connected between the plurality of power devices and at least one signal element;
   the signal connector comprises a first signal connector portion electrically connected to the at least one power substrate; and
   the signal connector comprises a second signal connector portion electrically connected to at least one signal element.

3. The power package of claim 1, wherein the power connector comprises the mechanically compliant fitting configured as a mechanical connection between the first power connector portion and the second power connector portion.

4. The power package of claim 1, wherein the power connector comprises an elastic compression component arranged in one of the first power connector portion and the second power connector portion.

5. The power package of claim 1, further comprising a housing and the at least one power element is arranged at least partially in the housing.

6. The power package of claim 1,
wherein the first power connector portion is connected to the at least one power substrate with at least one of the following: an ultrasonic welding construction, a solder construction, a brazing construction, and a swage type construction; and
wherein the second power connector portion is connected to the at least one power element with at least one of the following: an ultrasonic welding construction, a solder construction, a brazing construction, and a swage type construction.

7. The power package of claim 1, wherein the first power connector portion and the second power connector portion are configured with different gender component constructions comprising a male component construction and a female component construction.

8. The power package of claim 1, wherein the first power connector portion and the second power connector portion are configured with different gender component constructions comprising a cylinder construction and a pin construction.

9. The power package of claim 1 further comprising:
at least one signal element configured to exchange signals with the plurality of power devices;
the connector further comprises a signal connector configured to be electrically connected between the plurality of power devices and the at least one signal element;
the signal connector comprising a first signal connector portion electrically connected to the at least one power substrate;
the signal connector comprising a second signal connector portion electrically connected to the at least one signal element,
wherein the at least one signal element is connected to at least one signal terminal; and
wherein the signal connector comprises a mechanically compliant fitting.

10. The power package of claim 9, wherein the signal connector comprises a mechanical connection between the first signal connector portion and the second signal connector portion.

11. The power package of claim 9, wherein the signal connector comprises an elastic compression component arranged in one of the first signal connector portion and the second signal connector portion.

12. The power package of claim 9, further comprising a housing and the at least one signal element is arranged at least partially in the housing.

13. The power package of claim 9,
wherein the first signal connector portion is connected to the at least one power substrate with at least one of the following: an ultrasonic welding construction, a solder construction, a brazing construction, and a swage type construction; and
wherein the second signal connector portion is connected to the at least one signal element with at least one of the following: an ultrasonic welding construction, a solder construction, a brazing construction, and a swage type construction.

14. The power package of claim 9, wherein the first signal connector portion and the second signal connector portion are configured with different gender component constructions comprising a male component construction and a female component construction.

15. The power package of claim 9, wherein the first signal connector portion and the second signal connector portion are configured with different gender component constructions comprising a cylinder construction and a pin construction.

16. A system comprising at least one of the power package of claim 1, the system configured as one of the following: an inverter, a power system, a motor system, a converter, and an AC-DC power supply.

17. The power package of claim 1, wherein the connector is configured with a first gender component construction and a second gender component construction.

18. The power package of claim 1,
wherein the connector further comprises a signal connector having a first signal connector portion and a second signal connector portion; and
wherein the first signal connector portion is configured with a first gender component construction, the second signal connector portion is configured with a second gender component construction, and the first gender component construction is configured to electrically connect with the second gender component construction.

19. The power package of claim 1, further comprising:
one or more sensors,
wherein the one or more sensors are arranged on one of the following: the at least one power element and the at least one power substrate, and
wherein the one or more sensors are connected to at least one signal element.

20. A power package, comprising:
at least one power substrate;
a plurality of power devices arranged on the at least one power substrate; and
a connector configured to be electrically connected to the plurality of power devices,
wherein:
the connector comprises a mechanically compliant fitting;
the connector comprises a power connector that is configured to be electrically connected between the plurality of power devices and at least one power element;
the connector further comprises a signal connector that is configured to be electrically connected between the plurality of power devices and at least one signal element;
the power connector comprises a first power connector portion electrically connected to the at least one power substrate;
the power connector comprises a second power connector portion electrically connected to the at least one power element; and
the at least one power substrate is configured to provide electrical interconnection, voltage isolation, and/or heat transfer for the plurality of power devices.

21. The power package of claim 20, wherein:
the signal connector comprises a first signal connector portion electrically connected to the at least one power substrate; and
the signal connector comprises a second signal connector portion electrically connected to at least one signal element.

22. The power package of claim 20,
wherein the signal connector comprises a first signal connector portion and a second signal connector portion; and
wherein the first signal connector portion is configured with a first gender component construction, the second signal connector portion is configured with a second gender component construction, and the first gender component construction is configured to electrically connect with the second gender component construction.

23. The power package of claim 20, further comprising:
one or more sensors,
wherein the one or more sensors are arranged on one of the following: the at least one power element and the at least one power substrate, and
wherein the one or more sensors are connected to the at least one signal element.

24. The power package of claim 20, wherein the power connector comprises an elastic compression component arranged in one of the first power connector portion and the second power connector portion.

25. A power package, comprising:
at least one power substrate;
a plurality of power devices arranged on the at least one power substrate;
a power connector configured to be electrically connected to the plurality of power devices; and
at least one power element configured to conduct current with the plurality of power devices,
wherein the power connector comprises a mechanically compliant fitting;
wherein the power connector is further configured to be electrically connected between the plurality of power devices and the at least one power element;
wherein the at least one power substrate is configured to provide electrical interconnection, voltage isolation, and/or heat transfer for the plurality of power devices;
wherein the power connector comprises a first power connector portion electrically connected to the at least one power substrate;
wherein the power connector comprises a second power connector portion electrically connected to the at least one power element; and
wherein the at least one power element is connected to at least one power terminal.

26. The power package of claim 25, wherein the first power connector portion and the second power connector portion are configured with different gender component constructions comprising a male component construction and a female component construction.

27. The power package of claim 25, wherein the power connector is configured with a first gender component construction and a second gender component construction.

28. The power package of claim 25, further comprising a signal connector having a first signal connector portion and a second signal connector portion,
wherein the first signal connector portion is configured with a first gender component construction, the second signal connector portion is configured with a second gender component construction, and the first gender component construction is configured to electrically connect with the second gender component construction.

29. The power package of claim 25, further comprising:
one or more sensors,
wherein the one or more sensors are arranged on one of the following: the at least one power element and the at least one power substrate, and
wherein the one or more sensors are connected to at least one signal element.

30. The power package of claim 25, wherein the power connector comprises an elastic compression component arranged in one of the first power connector portion and the second power connector portion.

* * * * *